US008248853B2

(12) United States Patent
Lee et al.

(10) Patent No.: US 8,248,853 B2
(45) Date of Patent: Aug. 21, 2012

(54) METHODS OF PROGRAMMING NON-VOLATILE FLASH MEMORY DEVICES BY APPLYING A HIGHER VOLTAGE LEVEL TO A SELECTED WORD LINE THAN TO A WORD LINE NEIGHBORING THE SELECTED WORD LINE

(75) Inventors: Jae Duk Lee, SeongNam-shi (KR); Soon Moon Jung, SeongNam-shi (KR); Jung Dal Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 229 days.

(21) Appl. No.: 12/590,701

(22) Filed: Nov. 12, 2009

(65) Prior Publication Data
US 2010/0118606 A1    May 13, 2010

(30) Foreign Application Priority Data

Nov. 12, 2008    (KR) .................. 10-2005-0112237

(51) Int. Cl.
*G11C 11/34* (2006.01)
(52) U.S. Cl. .............................. 365/185.17; 365/185.23
(58) Field of Classification Search ............. 365/185.17, 365/185.12, 185.23
See application file for complete search history.

(56) References Cited

U.S. PATENT DOCUMENTS

| 7,057,931 B2 | 6/2006 | Lutze et al. |
| 7,212,435 B2* | 5/2007 | Rudeck et ................. 365/185.02 |
| 7,379,335 B2 | 5/2008 | Futatsuyama |
| 7,643,338 B2 | 1/2010 | Lee |
| 2005/0099849 A1 | 5/2005 | Lutze et al. |
| 2006/0279992 A1* | 12/2006 | Park et al. ................. 365/185.17 |
| 2007/0025152 A1 | 2/2007 | Futatsuyama |
| 2007/0258289 A1* | 11/2007 | Lue .......................... 365/185.18 |
| 2008/0084761 A1 | 4/2008 | Lee et al. |
| 2008/0123402 A1 | 5/2008 | Lee |
| 2010/0002520 A1 | 1/2010 | Lee |

FOREIGN PATENT DOCUMENTS

| JP | 2007-42165 A | 2/2007 |
| JP | 2008090996 A * | 4/2008 |
| KR | 10-2006-0120078 A | 11/2006 |
| KR | 10-0763093 B1 | 9/2007 |

* cited by examiner

*Primary Examiner* — Anh Phung
*Assistant Examiner* — Khamdan Alrobaie
(74) *Attorney, Agent, or Firm* — Onello & Mello, LLP

(57) ABSTRACT

In a method of programming a non-volatile memory device, a first voltage is applied to a selected word line corresponding to a selected memory cell transistor of a selected transistor string to be programmed; a second voltage is applied to a neighboring word line neighboring the selected word line and corresponding to a neighboring transistor of the selected transistor string, wherein the first voltage is greater than the second voltage, the application of the first and second voltages to the selected and neighboring word lines respectively causing electrons to be generated by an electric field formed between the neighboring transistor and the selected memory cell transistor, the electrons accelerating toward the selected memory cell transistor and injecting into a charge storage layer of the selected memory cell transistor; wherein the neighboring transistor is positioned between the selected memory cell transistor and one of a ground select transistor and a string select transistor, and the first voltage is applied to unselected word lines corresponding to unselected memory cell transistors of the selected transistor string positioned between the selected memory cell transistor and the other of the ground select transistor and the string select transistor.

19 Claims, 22 Drawing Sheets

Fig. 1B

|  | Program | Erase | Read |
|---|---|---|---|
| Selected BL | Vcc | Verase | 0.5 ~ 1V |
| Unselected BL | 0V | Verase | 0V |
| SSL0 | Vstep0 | Verase | Vread |
| SSL1 | Vstep1 | Verase | Vread |
| SSL2 | Vstep2 | Verase | Vread |
| WL[n] | Vpass | 0 ~ 1V | Vread |
| WL[n-1] | Vpass | 0 ~ 1V | Vread |
| ⋮ | ⋮ | ⋮ | ⋮ |
| WL[i+1] | Vpass | 0 ~ 1V | Vread |
| WL[i]-Selected WL | Vpass | 0 ~ 1V | Vr |
| WL[i-1] | 0V | 0 ~ 1V | Vread |
| ⋮ | ⋮ | ⋮ | ⋮ |
| WL[1] | 0V | 0 ~ 1V | Vread |
| WL[0] | 0V | 0 ~ 1V | Vread |
| GSL | 0V | Verase | Vread |
| CSL | 1.5V | Verase | 0V |
| PPW | 0V | Verase | 0V |

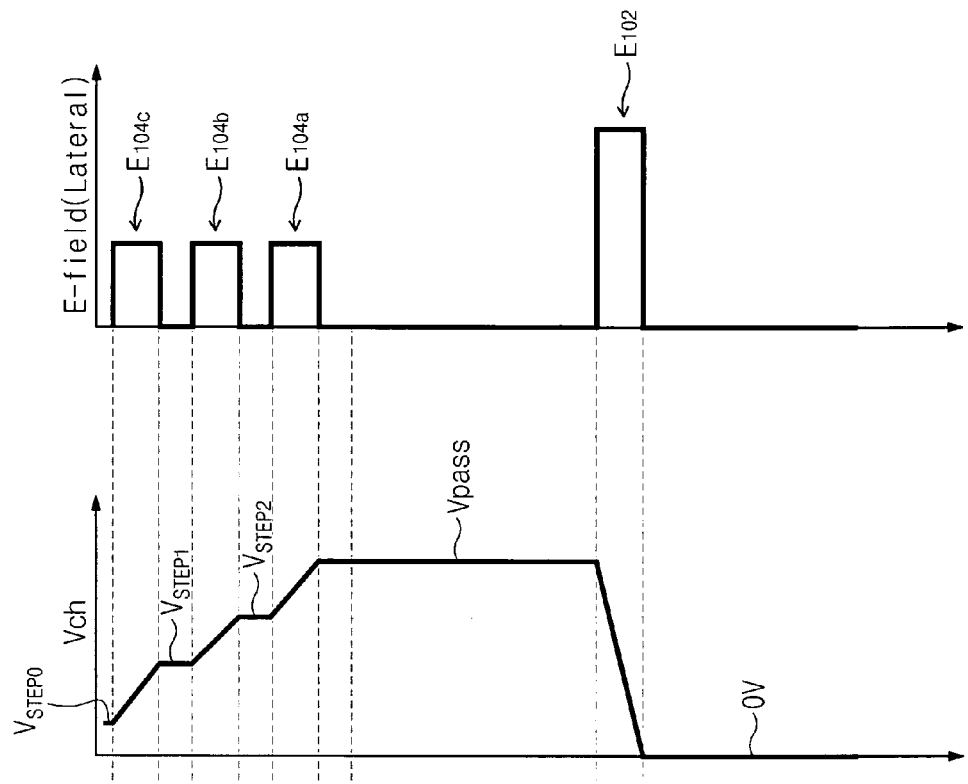

(Vhpass>Vpass)

METHODS OF PROGRAMMING NON-VOLATILE FLASH MEMORY DEVICES BY APPLYING A HIGHER VOLTAGE LEVEL TO A SELECTED WORD LINE THAN TO A WORD LINE NEIGHBORING THE SELECTED WORD LINE

RELATED APPLICATIONS

This application claims priority under 35 U.S.C. 119 to Korean Patent Application No. 10-2008-0112237, filed Nov. 12, 2008, the content of which is incorporated herein by reference in its entirety.

BACKGROUND

With the continued emphasis on highly integrated electronic devices, there is an ongoing need for semiconductor memory devices that operate at higher speeds and lower power and that have increased device density. To accomplish this, devices with aggressive scaling and multiple-layered devices with transistor cells arranged in horizontal and vertical arrays have been under development.

In contemporary non-volatile memory devices, programming operations are performed by applying a programming voltage Vpgm to a word line of a memory cell to be programmed, while a pass voltage Vpass is applied to word lines of unselected cell strings. At the same time, a ground voltage 0V is applied to a bit line of the cell string including the memory cell to be programmed, while a power voltage Vcc is applied to the bit lines corresponding to cell strings of unselected memory cells.

The programming voltage Vpgm is generally a very high voltage, such as 20V, which is strong enough to cause injection of electrons into the charge storage layer of the memory cell to be programmed. The electron injection is a result of the electric field generated between the control gate of the memory cell to be programmed to which the programming voltage Vpgm is applied, and the channel region of the memory cell to be programmed to which the ground voltage 0V is applied via the bit line. The resulting injection of electrons into the charge storage layer of the desired memory cell operates to program the memory cell.

Application of the programming voltage Vpgm to the word line connected to the memory cell to be programmed can also lead to inadvertent programming of other memory cells in other cell strings connected to the same word line. For this reason, a self-boosting programming operation has been developed by which the power voltage Vcc, rather than the ground voltage, is applied to the bit lines corresponding to cell strings of unselected memory cells. The self-boosting programming operation boosts the potential in the channel regions of transistors of the unselected cell strings, thereby reducing the electric field in the memory cells sharing the same word line as the selected memory cell. The reduced electric field is insufficient for causing the programming of cells in the unselected cell strings.

The self-boosting programming operation described above can modify the threshold voltages of other memory cells of the selected cell string and can modify the threshold voltages of other memory cells of unselected cell strings connected to the selected word line. Modification of the threshold voltages can cause overlapping of the program and erase voltages of the affected cells, which can lead to device malfunction. As devices become more highly integrated, lowering of the programming voltage Vpgm and the pass voltage Vpass is desired, rendering the resulting device more susceptible to the threshold voltage overlapping problem.

Further, as devices continue to become more highly integrated, unwanted programming of memory cells driven by the word line closest in proximity to the ground select line (GSL) can occur. Such programming occurs due to an effect known as Gate Induced Drain Leakage (GIDL). The GIDL effect results in the formation of an electron-hole pair. In one example, an electron-hole pair can be created when an electric field greater than about 1 MV/cm is applied. With further integration of devices, the electric field concentration is generally increased, which worsens the GIDL effect in contemporary devices.

To overcome the GIDL effect, devices are being configured to include dummy word lines inserted between the ground select line GSL and the first word line W0, and dummy memory cells inserted between the corresponding ground select transistors and the first memory cell transistors driven by the first word line W0, increasing the distance between them. However, this approach consumes valuable chip area, which is at a premium in highly integrated devices.

SUMMARY

Embodiments of the present invention are directed to methods of programming memory devices that address and overcome the limitations of the conventional methods. Further, embodiments of the present invention are directed to memory devices programmed according to methods that address and overcome such limitations, as well as systems employing such memory devices. In particular, embodiments of the present invention employ GIDL-type programming for performing a programming operation on memory cells, and, in particular, for programming memory cells of non-volatile memory devices. As a result, application of the programming voltage Vpgm applied under conventional programming operations is not required; only application of the pass voltage Vpass is used. Also, inadvertent disturbance of threshold voltages Vth of transistors of the same cell string as the memory cell to be programmed and threshold voltages Vth of transistors connected the same word line as the memory cell to be programmed is mitigated or eliminated. Further, inadvertent programming of the word line closest in proximity to the ground select line (GSL) is avoided.

In one aspect, in a method of programming a non-volatile memory device, the memory device includes: a plurality of memory cell transistors arranged in a plurality of transistor strings, wherein a transistor string includes a plurality of memory cell transistors arranged in series; a plurality of word lines, each word line connected to a corresponding memory cell transistor of each of the different transistor strings; and a plurality of bit lines, each bit line connected to one of the transistor strings. The method comprises: applying a first voltage to a selected word line corresponding to a selected memory cell transistor of a selected transistor string to be programmed; and applying a second voltage to a neighboring word line neighboring the selected word line and corresponding to a neighboring transistor of the selected transistor string, wherein the first voltage is greater than the second voltage, the application of the first and second voltages to the selected and neighboring word lines respectively causing electrons to be generated by an electric field formed between the neighboring transistor and the selected memory cell transistor, the electrons accelerating toward the selected memory cell transistor and injecting into a charge storage layer of the selected memory cell transistor.

In one embodiment, the neighboring transistor comprises a neighboring memory cell transistor of the selected transistor string.

In another embodiment, the neighboring transistor comprises a neighboring select transistor of the selected transistor string.

In another embodiment, the neighboring select transistor comprises one of a string select transistor and a ground select transistor of the selected transistor string.

In another embodiment, applying the first voltage to the selected word line comprises applying a first voltage that comprises a pulsed signal that has a voltage value that incrementally increases at each pulse.

In another embodiment, the method further comprises applying a third voltage to a bit line corresponding to the selected transistor string and applying a fourth voltage to bit lines corresponding to unselected transistor strings, wherein the third voltage is at a voltage level that is greater than the fourth voltage, wherein the third voltage is at a voltage level that is sufficient to channel-boost a channel region of the selected memory cell transistor of the selected transistor string, and wherein the fourth voltage is at a voltage level that is insufficient to channel-boost channel regions of memory cell transistors of the unselected transistor strings.

In another embodiment, the third voltage is at a Vcc voltage level and wherein the fourth voltage is at a GND voltage level.

In another embodiment, each transistor string includes a plurality of the memory cell transistors arranged in series between a string select transistor and a ground select transistor and wherein the neighboring transistor is positioned between the selected memory cell transistor and one of the ground select transistor and the string select transistor, and the method further comprises: applying the first voltage to unselected word lines corresponding to unselected memory cell transistors of the selected transistor string positioned between the selected memory cell transistor and the other of the ground select transistor and the string select transistor.

In another embodiment, each transistor string includes a plurality of the memory cell transistors arranged in series between a string select transistor and a ground select transistor and wherein the neighboring transistor is positioned between the selected memory cell transistor and one of the ground select transistor and the string select transistor, and the method further comprises: applying a fifth voltage to unselected word lines corresponding to unselected memory cell transistors of the selected transistor string positioned between the selected memory cell transistor and the other of the ground select transistor and the string select transistor, wherein the fifth voltage is less than the first voltage and wherein the fifth voltage is greater than the second voltage.

In another embodiment, each transistor string includes a plurality of the memory cell transistors arranged in series between a string select transistor and a ground select transistor and wherein the neighboring transistor is positioned between the selected memory cell transistor and one of the ground select transistor and the string select transistor, and the method further comprises: applying the second voltage to unselected word lines positioned between the neighboring transistor and the one of the ground select transistor and the string select transistor.

In another embodiment, each transistor string includes a plurality of the memory cell transistors arranged in series between a string select transistor and a ground select transistor and wherein the neighboring transistor is positioned between the selected memory cell transistor and one of the ground select transistor and the string select transistor, and the method further comprises: applying a sixth voltage to unselected word lines positioned between the neighboring transistor and the one of the ground select transistor and the string select transistor, wherein the sixth voltage is less than the first voltage and wherein the sixth voltage is greater than the second voltage.

In another embodiment, each transistor string includes a plurality of the memory cell transistors arranged in series between an end string select transistor and a ground select transistor and wherein the memory device further includes a plurality of string select lines, each string select line connected to one of a corresponding end string select transistor of each of the different transistor strings, and at least one dummy string select transistor neighboring the end string select transistor, and the method further comprises: applying a plurality of descending voltage signals to the plurality of string select lines, the descending voltage signals having different voltage levels, the voltage level being greatest for the descending voltage signal applied to the string select line most proximal to the selected word line, and the voltage level being lowest for the descending voltage signal applied to the string select line connected to the end string select transistor.

In another embodiment, the plurality of descending voltage signals are each at a voltage level less than the first voltage.

In another embodiment, the plurality of descending voltage signals comprises at least three signals and wherein a difference between voltage levels of descending voltage signals applied to neighboring string select lines is substantially constant.

In another embodiment, the plurality of descending voltage signals comprises at least three signals and wherein differences between voltage levels of descending voltage signals applied to neighboring string select lines are substantially different.

In another embodiment, applying the plurality of descending voltage signals comprises, for each of the descending voltage signals, applying a voltage signal that comprises a pulsed signal that has a voltage value that incrementally increases at each pulse.

In another embodiment, each transistor string includes a plurality of the memory cell transistors arranged in series between a string select transistor and a ground select transistor, and wherein the memory device further includes a string select line, the string select line connected to a string select transistor of each of the different transistor strings and the method further comprises: applying a plurality of descending voltage signals to the string select line and to at least one word line neighboring the string select line of the transistor string, the descending voltage signals having different voltage levels, the voltage level being greatest for the descending voltage signal applied to the word line most proximal to the selected word line, and the voltage level being lowest for the descending voltage signal applied to the string select line connected to the string select transistor.

In another embodiment, the plurality of descending voltage signals are each at a voltage level less than the first voltage.

In another embodiment, the plurality of descending voltage signals comprises at least three signals and wherein a difference between voltage levels of descending voltage signals applied to neighboring ones of the string select line and to at least one word line neighboring the string select line is substantially constant.

In another embodiment, the plurality of descending voltage signals comprises at least three signals and wherein differences between voltage levels of descending voltage signals applied to neighboring ones of the string select line and to at least one word line neighboring the string select line are substantially different.

In another embodiment, applying the plurality of descending voltage signals comprises, for each of the descending voltage signals, applying a voltage signal that comprises a pulsed signal that has a voltage value that incrementally increases at each pulse.

In another embodiment, each transistor string includes a plurality of the memory cell transistors arranged in series between a string select transistor and a ground select transistor, and wherein the memory device further includes a string select line, the string select line connected to a string select transistor of each of the different transistor strings and wherein the plurality of memory cell transistors are spaced apart from each other by a first distance, and wherein the string select transistor is spaced apart from a neighboring memory cell transistor by a second distance that is greater than the first distance.

In another embodiment, each transistor string includes a plurality of the memory cell transistors arranged in series between a string select transistor and an end ground select transistor and wherein the memory device further includes a plurality of ground select lines, each ground select line connected to one of a corresponding end ground select transistor of each of the different transistor strings, and at least one dummy ground select transistor neighboring the end ground select transistor, and the method further comprises: applying a plurality of descending voltage signals to the plurality of ground select lines, the descending voltage signals having different voltage levels, the voltage level being greatest for the descending voltage signal applied to the ground select line most proximal to the selected word line, and the voltage level being lowest for the descending voltage signal applied to the ground select line connected to the end ground select transistor.

In another embodiment, the plurality of descending voltage signals comprises at least three signals and wherein a difference between voltage levels of descending voltage signals applied to neighboring ground select lines is substantially constant.

In another embodiment, the plurality of descending voltage signals comprises at least three signals and wherein differences between voltage levels of descending voltage signals applied to neighboring ground select lines are substantially different.

In another embodiment, the plurality of descending voltage signals are each at a voltage level less than the first voltage.

In another embodiment, applying the plurality of descending voltage signals comprises, for each of the descending voltage signals, applying a voltage signal that comprises a pulsed signal that has a voltage value that incrementally increases at each pulse.

In another embodiment, each transistor string includes a plurality of the memory cell transistors arranged in series between a string select transistor and a ground select transistor, and wherein the memory device further includes a ground select line, the ground select line connected to a ground select transistor of each of the different transistor strings and the method further comprises: applying a plurality of descending voltage signals to the ground select line and to at least one word line neighboring the ground select line of the transistor string, the descending voltage signals having different voltage levels, the voltage level being greatest for the descending voltage signal applied to the word line most proximal to the selected word line, and the voltage level being lowest for the descending voltage signal applied to the ground select line connected to the ground select transistor.

In another embodiment, the plurality of descending voltage signals comprises at least three signals and wherein a difference between voltage levels of descending voltage signals applied to neighboring ones of the ground select line and to at least one word line neighboring the ground select line is substantially constant.

In another embodiment, the plurality of descending voltage signals comprises at least three signals and wherein differences between voltage levels of descending voltage signals applied to neighboring ones of the ground select line and to at least one word line neighboring the ground select line are substantially different.

In another embodiment, the plurality of descending voltage signals are each at a voltage level less than the first voltage.

In another embodiment, applying the plurality of descending voltage signals comprises, for each of the descending voltage signals, applying a voltage signal that comprises a pulsed signal that has a voltage value that incrementally increases at each pulse.

In another embodiment, each transistor string includes a plurality of the memory cell transistors arranged in series between a string select transistor and a ground select transistor, and wherein the memory device further includes a ground select line, the ground select line connected to a ground select transistor of each of the different transistor strings and wherein the plurality of memory cell transistors are spaced apart from each other by a first distance, and wherein the ground select transistor is spaced apart from a neighboring memory cell transistor by a second distance that is greater than the first distance.

In another embodiment, the first voltage is in a range of about 6 volts to about 12 volts.

In another embodiment, the second voltage is in a range of about −30 volts to about 2 volts.

In another embodiment, the memory cell transistors comprise a transistor type selected from the group consisting of SONOS-type, SANOS-type, TANOS-type, CTF-type and, floating gate type.

In another embodiment, the transistor strings of the memory device are configured as a configuration selected from the group consisting of: planar strings extending in a horizontal direction relative to a base substrate and vertical strings extending in a vertical direction relative to a base substrate.

In another embodiment, a multiple-level cell (MLC) programming operation of a non-volatile memory device includes the method of programming.

In another embodiment, a shadow programming operation of a non-volatile memory device including the method of programming.

In another embodiment, each transistor string includes a plurality of the memory cell transistors arranged in series between a string select transistor and a ground select transistor, and the method further comprises: repeating the application of the first voltage and second voltage in an ascending order of the word lines beginning with the word line most proximal to the ground select transistor for programming memory cells connected to the respective word lines in the ascending order.

In another embodiment, each transistor string includes a plurality of the memory cell transistors arranged in series between a string select transistor and a ground select transistor, and the method further comprises: repeating the application of the first voltage and second voltage in an descending order of the word lines beginning with the word line most proximal to the ground select transistor for programming memory cells connected to the respective word lines in the descending order.

In another aspect, in a method of programming a non-volatile memory device, the memory device includes: a plurality of memory cell transistors arranged in a plurality of transistor strings; a plurality of word lines, each word line connected to a corresponding memory cell transistor of each of the different transistor strings; and a plurality of bit lines, each bit line connected to one of the transistor strings. The method comprises: applying a first voltage to a selected word line corresponding to a selected memory cell transistor of a selected transistor string to be programmed; and applying a second voltage to a neighboring word line neighboring the selected word line and corresponding to a neighboring transistor of the selected transistor string, wherein the first voltage is greater than the second voltage, wherein each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising: applying the first voltage to unselected word lines corresponding to unselected memory cell transistors of the selected transistor string positioned between the selected memory cell transistor and the other of the ground select transistor and the string select transistor; and applying the second voltage to unselected word lines positioned between the neighboring transistor and the one of the ground select transistor and the string select transistor.

In one embodiment, the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another embodiment, the method further comprises applying a third voltage to a bit line corresponding to the selected transistor string and applying a fourth voltage to bit lines corresponding to unselected transistor strings, wherein the third voltage is at a voltage level that is greater than the fourth voltage, wherein the third voltage is at a voltage level that is sufficient to channel-boost a channel region of the selected memory cell transistor of the selected transistor string, and wherein the fourth voltage is at a voltage level that is insufficient to channel-boost channel regions of memory cell transistors of the unselected transistor strings.

In another embodiment, the method further comprises: applying a fifth voltage to unselected word lines corresponding to unselected memory cell transistors of the selected transistor string positioned between the selected memory cell transistor and the other of the ground select transistor and the string select transistor, wherein the fifth voltage is less than the first voltage and wherein the fifth voltage is greater than the second voltage.

In another embodiment, the method further comprises: applying a sixth voltage to unselected word lines positioned between the neighboring transistor and the one of the ground select transistor and the string select transistor, wherein the sixth voltage is less than the first voltage and wherein the sixth voltage is greater than the second voltage.

In another aspect, a non-volatile memory device, comprises: a plurality of memory cell transistors arranged in a plurality of transistor strings; a plurality of word lines, each word line connected to a corresponding memory cell transistor of each of the different transistor strings; and a plurality of bit lines, each bit line connected to different transistor strings; and a programming operation signal controller that, during a programming operation: applies a first voltage to a selected word line corresponding to a selected memory cell transistor of a selected transistor string to be programmed; and applies a second voltage to a neighboring word line neighboring the selected word line and corresponding to a neighboring transistor of the selected transistor string, wherein the first voltage is greater than the second voltage, wherein the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another aspect, a non-volatile memory device comprises: a plurality of memory cell transistors arranged in a plurality of transistor strings; a plurality of word lines, each word line connected to a corresponding memory cell transistor of each of the different transistor strings; and a plurality of bit lines, each bit line connected to different transistor strings, each transistor string including a plurality of the memory cell transistors arranged in series between an end string select transistor and a ground select transistor; a plurality of string select lines, each string select line connected to one of a corresponding end string select transistor of each of the different transistor strings and at least one dummy string select transistor neighboring the end string select transistor, and a programming operation signal controller that, during a programming operation of a selected one of the memory cell transistors: applies a first voltage to a selected word line corresponding to the selected memory cell transistor of a selected transistor string, applies a second voltage to a neighboring word line neighboring the selected word line and corresponding to a neighboring transistor of the selected transistor string, wherein the first voltage is greater than the second voltage, and applies a plurality of descending voltage signals to the plurality of string select lines, the descending voltage signals having different voltage levels, the voltage level being greatest for the descending voltage signal applied to the string select line most proximal to the selected word line, and the voltage level being lowest for the descending voltage signal applied to the string select line connected to the end string select transistor.

In one embodiment, the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another embodiment, the non-volatile memory device comprises at least one dummy string select transistors and at least two string select lines and wherein the plurality of descending voltage signals comprises at least two signals and wherein a difference between voltage levels of descending voltage signals applied to neighboring string select lines is substantially constant.

In another embodiment, the non-volatile memory device comprises at least one dummy string select transistors and at least two string select lines and wherein the plurality of descending voltage signals comprises at least two signals and wherein differences between voltage levels of descending voltage signals applied to neighboring string select lines are substantially different.

In another embodiment, the plurality of descending voltage signals are each at a voltage level less than the first voltage.

In another aspect, a non-volatile memory device comprises: a plurality of memory cell transistors arranged in a plurality of transistor strings; a plurality of word lines, each word line connected to a corresponding memory cell transistor of each of the different transistor strings; and a plurality of bit lines, each bit line connected to different transistor strings, each transistor string including a plurality of the memory cell transistors arranged in series between a string select transistor and a ground select transistor; a string select line connected to a string select transistor of each of the different transistor strings, wherein the plurality of memory cell transistors are spaced apart from each other by a first distance, and wherein the string select transistor is spaced apart from a neighboring memory cell transistor by a second distance that is greater than the first distance, and a programming operation signal controller that, during a programming operation of a selected one of the memory cell transistors: applies a first voltage to a selected word line corresponding to the selected memory cell transistor of a selected transistor string, and applies a second voltage to a neighboring word line neighboring the selected word line and corresponding to a neighboring transistor of the selected transistor string, wherein the first voltage is greater than the second voltage.

In one embodiment, the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another aspect, a non-volatile memory device comprises: a plurality of memory cell transistors arranged in a plurality of transistor strings; a plurality of word lines, each word line connected to a corresponding memory cell transistor of each of the different transistor strings; and a plurality of bit lines, each bit line connected to different transistor strings, each transistor string including a plurality of the memory cell transistors arranged in series between a string select transistor and an end ground select transistor; a plurality of ground select lines, each ground select line connected to one of a corresponding end ground select transistor of each of the different transistor strings and at least one dummy ground select transistor neighboring the end ground select transistor, and a programming operation signal controller that, during a programming operation of a selected one of the memory cell transistors: applies a first voltage to a selected word line corresponding to the selected memory cell transistor of a selected transistor string, applies a second voltage to a neighboring word line neighboring the selected word line and corresponding to a neighboring transistor of the selected transistor string, wherein the first voltage is greater than the second voltage, and applies a plurality of descending voltage signals to the plurality of ground select lines, the descending voltage signals having different voltage levels, the voltage level being greatest for the descending voltage signal applied to the ground select line most proximal to the selected word line, and the voltage level being lowest for the descending voltage signal applied to the ground select line connected to the end ground select transistor.

In one embodiment, the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another embodiment, the non-volatile memory device comprises at least one dummy ground select transistors and at least two ground select lines and wherein the plurality of descending voltage signals comprises at least two signals and wherein a difference between voltage levels of descending voltage signals applied to neighboring ground select lines is substantially constant.

In another embodiment, the non-volatile memory device comprises at least one dummy ground select transistors and at least two ground select lines and wherein the plurality of descending voltage signals comprises at least two signals and wherein differences between voltage levels of descending voltage signals applied to neighboring ground select lines are substantially different.

In another embodiment, the plurality of descending voltage signals are each at a voltage level less than the first voltage.

In another aspect, a non-volatile memory device comprises: a plurality of memory cell transistors arranged in a plurality of transistor strings; a plurality of word lines, each word line connected to a corresponding memory cell transistor of each of the different transistor strings; and a plurality of bit lines, each bit line connected to different transistor strings, each transistor string including a plurality of the memory cell transistors arranged in series between a string select transistor and a ground select transistor; a ground select line connected to a ground select transistor of each of the different transistor strings, wherein the plurality of memory cell transistors are spaced apart from each other by a first distance, and wherein the ground select transistor is spaced apart from a neighboring memory cell transistor by a second distance that is greater than the first distance, and a programming operation signal controller that, during a programming operation of a selected one of the memory cell transistors: applies a first voltage to a selected word line corresponding to the selected memory cell transistor of a selected transistor string, and applies a second voltage to a neighboring word line neighboring the selected word line and corresponding to a neighboring transistor of the selected transistor string, wherein the first voltage is greater than the second voltage.

In one embodiment, the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a plurality of memory cell transistors arranged in a plurality of transistor strings; a plurality of word lines, each word line connected to a corresponding memory cell transistor of each of the different transistor strings; and a plurality of bit lines, each bit line connected to different transistor strings; and a programming operation signal controller that, during a programming operation: applies a first voltage to a selected word line corresponding to a selected memory cell transistor of a selected transistor string to be programmed; and applies a second voltage to a neighboring word line neighboring the selected word line and corresponding to a neighboring transistor of the selected transistor string, wherein the first voltage is greater than the second voltage, wherein the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

In another aspect, in a method of programming a non-volatile memory device, the memory device includes: a plurality of memory cell transistors arranged in a plurality of transistor strings, wherein a transistor string includes a plurality of memory cell transistors arranged in series; a plurality of word lines, each word line connected to a corresponding memory cell transistor of each of the different transistor strings; and a plurality of bit lines, each bit line connected to one of the transistor strings, the method comprising: applying a first voltage to a selected word line corresponding to a selected memory cell transistor of a selected transistor string to be programmed; and applying a second voltage to a neighboring word line neighboring the selected word line and corresponding to a neighboring transistor of the selected transistor string, wherein the first voltage is greater than the second voltage, the application of the first and second voltages to the selected and neighboring word lines respectively causing electrons to be generated by an electric field formed between the neighboring transistor and the selected memory cell transistor, the electrons accelerating toward the selected memory cell transistor and injecting into a charge storage layer of the selected memory cell transistor.

In one embodiment, applying the first voltage to the selected word line comprises applying a first voltage that comprises a pulsed signal that has a voltage value that incrementally increases at each pulse.

In another embodiment, the method further comprises applying a third voltage to a bit line corresponding to the selected transistor string and applying a fourth voltage to bit lines corresponding to unselected transistor strings, wherein the third voltage is at a voltage level that is greater than the fourth voltage, wherein the third voltage is at a voltage level that is sufficient to channel-boost a channel region of the selected memory cell transistor of the selected transistor string, and wherein the fourth voltage is at a voltage level that is insufficient to channel-boost channel regions of memory cell transistors of the unselected transistor strings.

In another embodiment, each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising: applying the first voltage to unselected word lines corresponding to unselected memory cell transistors of the selected transistor string positioned between the selected memory cell transistor and the other of the ground select transistor and the string select transistor.

In another embodiment, each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising: applying a fifth voltage to unselected word lines corresponding to unselected memory cell transistors of the selected transistor string positioned between the selected memory cell transistor and the other of the ground select transistor and the string select transistor, wherein the fifth voltage is less than the first voltage and wherein the fifth voltage is greater than the second voltage.

In another embodiment, each transistor string includes a plurality of the memory cell transistors arranged in series between an end string select transistor and a ground select transistor and wherein the memory device further includes a plurality of string select lines, each string select line connected to one of a corresponding end string select transistor of each of the different transistor strings, and at least one dummy string select transistor neighboring the end string select transistor, and further comprising: applying a plurality of descending voltage signals to the plurality of string select lines, the descending voltage signals having different voltage levels, the voltage level being greatest for the descending voltage signal applied to the string select line most proximal to the selected word line, and the voltage level being lowest for the descending voltage signal applied to the string select line connected to the end string select transistor.

In another embodiment, applying the plurality of descending voltage signals comprises, for each of the descending voltage signals, applying a voltage signal that comprises a pulsed signal that has a voltage value that incrementally increases at each pulse.

In another embodiment, each transistor string includes a plurality of the memory cell transistors arranged in series between a string select transistor and a ground select transistor, and wherein the memory device further includes a string select line, the string select line connected to a string select transistor of each of the different transistor strings and further comprising: applying a plurality of descending voltage signals to the string select line and to at least one word line neighboring the string select line of the transistor string, the descending voltage signals having different voltage levels, the voltage level being greatest for the descending voltage signal applied to the word line most proximal to the selected word line, and the voltage level being lowest for the descending voltage signal applied to the string select line connected to the string select transistor.

In another embodiment, each transistor string includes a plurality of the memory cell transistors arranged in series between a string select transistor and a ground select transistor, and wherein the memory device further includes a string select line, the string select line connected to a string select transistor of each of the different transistor strings and wherein the plurality of memory cell transistors are spaced apart from each other by a first distance, and wherein the string select transistor is spaced apart from a neighboring memory cell transistor by a second distance that is greater than the first distance.

In another embodiment, each transistor string includes a plurality of the memory cell transistors arranged in series between a string select transistor and an end ground select transistor and wherein the memory device further includes a plurality of ground select lines, each ground select line connected to one of a corresponding end ground select transistor of each of the different transistor strings, and at least one dummy ground select transistor neighboring the end ground select transistor, and further comprising: applying a plurality of descending voltage signals to the plurality of ground select lines, the descending voltage signals having different voltage levels, the voltage level being greatest for the descending voltage signal applied to the ground select line most proximal to the selected word line, and the voltage level being lowest for the descending voltage signal applied to the ground select line connected to the end ground select transistor.

In another embodiment, each transistor string includes a plurality of the memory cell transistors arranged in series between a string select transistor and a ground select transistor, and wherein the memory device further includes a ground select line, the ground select line connected to a ground select transistor of each of the different transistor strings and further comprising: applying a plurality of descending voltage signals to the ground select line and to at least one word line neighboring the ground select line of the transistor string, the descending voltage signals having different voltage levels, the voltage level being greatest for the descending voltage signal applied to the word line most proximal to the selected word line, and the voltage level being lowest for the descending voltage signal applied to the ground select line connected to the ground select transistor.

In another embodiment, the first voltage is in a range of about 6 volts to about 12 volts.

In another embodiment, the second voltage is in a range of about −30 volts to about 2 volts.

In another embodiment, the memory cell transistors comprise a transistor type selected from the group consisting of SONOS-type, SANOS-type, TANOS-type, CTF-type and, floating gate type.

In another embodiment, a multiple-level cell (MLC) programming operation of a non-volatile memory device includes the above method of programming.

In another embodiment, a shadow programming operation of a non-volatile memory device includes the above method of programming.

In another embodiment, each transistor string includes a plurality of the memory cell transistors arranged in series between a string select transistor and a ground select transistor, and further comprising: repeating the application of the first voltage and second voltage in an ascending order of the word lines beginning with the word line most proximal to the ground select transistor for programming memory cells connected to the respective word lines in the ascending order.

In another embodiment, each transistor string includes a plurality of the memory cell transistors arranged in series between a string select transistor and a ground select transistor, and further comprising: repeating the application of the first voltage and second voltage in an descending order of the word lines beginning with the word line most proximal to the ground select transistor for programming memory cells connected to the respective word lines in the descending order.

In another aspect, in a method of programming a non-volatile memory device, the memory device includes: a plurality of memory cell transistors arranged in a plurality of transistor strings; a plurality of word lines, each word line connected to a corresponding memory cell transistor of each of the different transistor strings; and a plurality of bit lines, each bit line connected to one of the transistor strings, the method comprising: applying a first voltage to a selected word line corresponding to a selected memory cell transistor of a selected transistor string to be programmed; and applying a second voltage to a neighboring word line neighboring the selected word line and corresponding to a neighboring transistor of the selected transistor string, wherein the first voltage is greater than the second voltage, wherein each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising: applying the first voltage to unselected word lines corresponding to unselected memory cell transistors of the selected transistor string positioned between the selected memory cell transistor and the other of the ground select transistor and the string select transistor; and applying the second voltage to unselected word lines positioned between the neighboring transistor and the one of the ground select transistor and the string select transistor.

In one embodiment, the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIG. 1B illustrates example voltages applied to the memory cell array circuit of FIG. 1A during programming, erase and read operations, in accordance with an embodiment of the present invention.

FIG. 3A is a schematic diagram of a memory cell array circuit illustrating a memory cell programming operation in accordance with an embodiment of the present invention. FIG. 3B illustrates the voltage potential with respect to position at various positions along a channel of a selected cell string, in accordance with an embodiment of the present invention. FIG. 3C illustrates the lateral electric field with respect to position at various positions along a channel of a selected cell string, in accordance with an embodiment of the present invention.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1A:
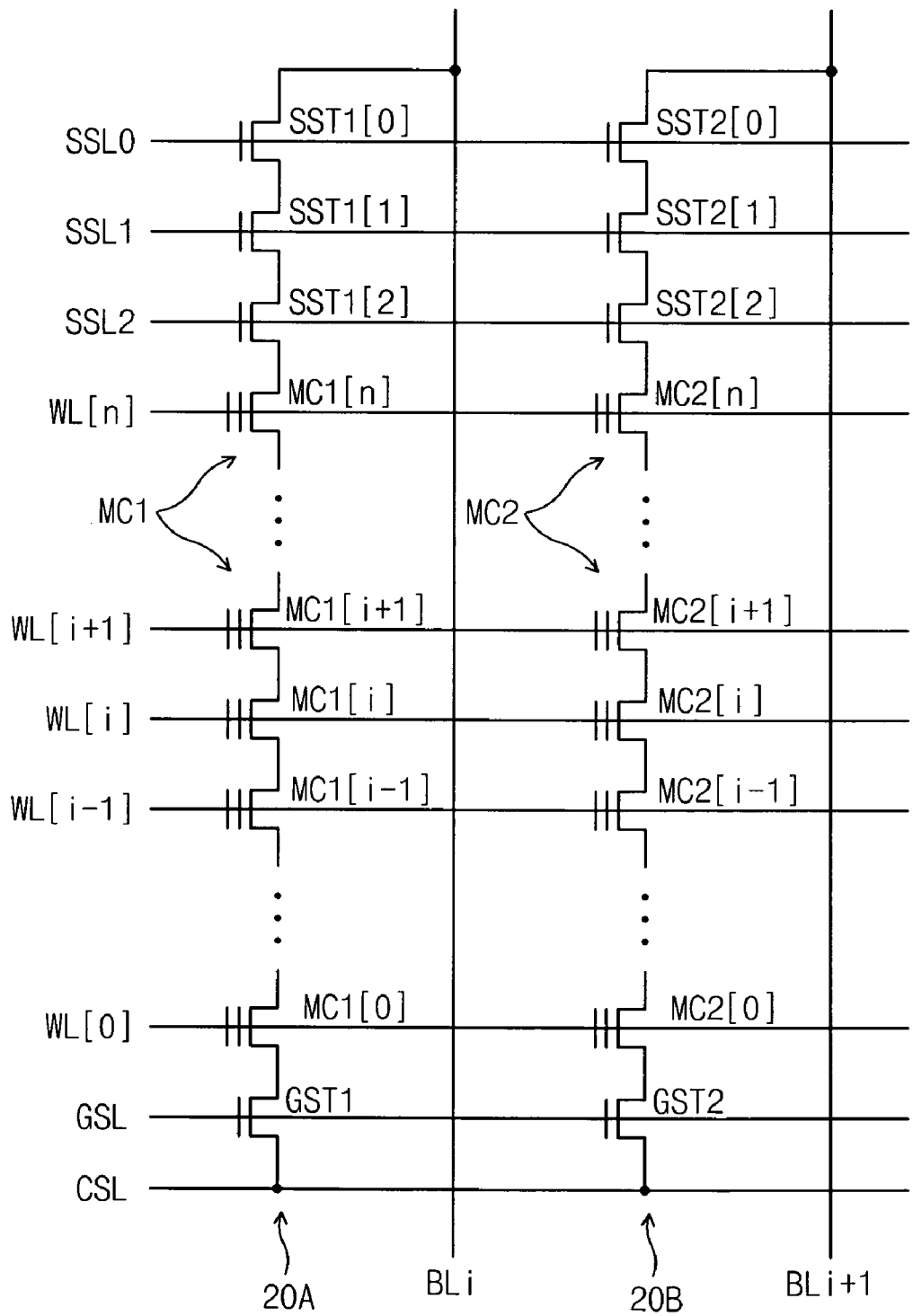
FIG. 1A is a schematic diagram of a memory cell array circuit illustrating a memory cell programming operation in accordance with an embodiment of the present invention.

FIG. 1A is a schematic diagram of a memory cell array circuit illustrating a memory cell programming operation in accordance with an embodiment of the present invention. FIG. 1B illustrates example voltages applied to the memory cell array circuit of FIG. 1A during programming, erase and read operations, in accordance with an embodiment of the present invention.

Referring to FIGS. 1A and 1B, a memory cell array includes a plurality of memory cells MC arranged in rows and columns. A plurality of first memory cells MC1 are arranged in series between a first string select transistor SST1 and a first ground select transistor GST1. Together, the first memory cells MC1, the first string select transistor SST1 and the first ground select transistor GST1 combine to form a first cell string 20A. A plurality of second memory cells MC2 are similarly arranged in series between a second string select transistor SST2 and a second ground select transistor GST2. Together, the second memory cells MC2, the second string select transistor SST2 and the second ground select transistor GST2 combine to form a second cell string 20B. A first bit line BL[i] of the device is connected to the first string select transistor SST1 of the first string 20A and a second bit line BL[i+1] of the device is connected to the second string select transistor SST2 of the second string 20B. Gates of corresponding ground select transistors GST1, GST2, GSTm are connected to a ground select line GSL of the device. Gates of corresponding string select transistors SST1[0], SST2[0], SSTm[0] are connected to a string select line SSL0 of the device. Control gates of corresponding memory cell transistors MC1[$n$], MC2[$n$], MCm[$n$] of different cell strings 20A, 20B are connected to a word line WL[$n$] of the device. In this example, the reference letter "n" refers to the number of memory cell transistors MC1[$n$] in each cell string, and the reference letter "m" refers to the cell strings in the memory cell block.

In this example embodiment, each cell string 20A, 20B includes multiple string select transistors SST1[0], SST1[1], SST1[2] positioned in series between the uppermost memory cell transistor MC1[$n$] and the bit line BL[i]. For example, three string select transistors SST1[0], SST1[1], SST1[2] are shown in this example. In other embodiments, each cell string can similarly include one or more ground select transistors GST1 in series between the lowermost memory cell transistor MC1[0] and the common source line CSL.

During a programming operation of the memory cell array circuit in accordance with embodiments of the present invention, a GIDL-type effect is intentionally produced in the region of the memory cell to be programmed, in order to perform the programming operation. In particular, a first voltage is applied to a selected word line corresponding to a selected memory cell of a selected transistor string to be programmed. In this example, memory cell transistor MC1[$i$] is selected to be programmed. Accordingly, a relatively high voltage, for example, a Vpass level voltage, is applied to the selected word line WL[i] connected to the control gate of the selected memory cell MC1[$i$].

At the same time, a second voltage is applied to a neighboring word line neighboring the selected word line and corresponding to a neighboring transistor of the selected transistor string, the first voltage being greater than the second voltage. In this example, memory cell transistor MC1[$i$−1] is neighboring the selected memory transistor cell MC1[$i$]. Accordingly, a relatively low voltage, for example a voltage at or near a ground voltage GND or 0V, is applied to the neighboring word line WL[i−1] connected to the control gate of the neighboring memory cell MC1[$i$−1] neighboring the selected memory cell MC1[$i$].

Under the GIDL-like effect, the application of the first and second voltages to the selected and neighboring word lines WL[i], WL[i−1] respectively causes electrons to be generated by an electric field formed between the neighboring transistor MC[i−1] and the selected memory cell transistor MC[i]. As a result, the thereby-generated electrons accelerate toward the selected memory cell transistor MC[i] and are injected into a charge storage layer of the selected memory cell transistor MC[i].

This GIDL-like effect is enhanced by the application of a power voltage Vcc to the selected bit line BLi of the selected memory string 20A including the selected memory cell transistor MC1[$i$], and the application of a low voltage, such as a ground voltage GND or 0V, to unselected bit lines BL[i+1], BL[i−1], etc. The power voltage Vcc applied to the selected bit line BLi of the selected memory string 20A is sufficient to channel boost the channel region of the selected memory cell transistor and the low voltage, applied to the unselected bit lines BL[i+1], BL[i−1], etc. is insufficient to channel boost the channel regions of the unselected memory cell transistors.

In order for a transistor to be activated, the condition Vg−Vs>Vt should be met, where Vg is the gate voltage, Vs is the source voltage and Vt is the threshold voltage of the transistor. On the contrary, for a transistor to be deactivated, or turned off, the condition Vg−Vs<Vt should be met. To program a memory cell string, the string to be programmed should be channel boosted; hence the bit line voltage should to be sufficiently high to turn off the select transistor. To do so, the condition $V_{SSL0}-V_{BLi}$<Vt should be met. Therefore a voltage sufficient to channel boost refers to a voltage $V_{BLi}$ that is applied to the bit line. For example, assuming $V_{SSL}$=2V and Vt=1.2V, then $V_{BLi}$ should be more than 0.8V (=2V−1.2V). If VBLi is less than 0.8V, the channel cannot be boosted, and therefore, a $V_{BLi}$ voltage at a level less than 0.8V is an insufficient voltage to boost the channel.

At the same time, a step voltage Vstep can be applied to the at least one string select line SSL0, SSL1, SSL2, etc., connected to the gates of the at least one string select transistors SST1[0], SST1[1], SST1[2], etc. Also, a low voltage, such as a ground voltage GND or 0V, is applied to the ground select line GSL connected to the gates of one or more ground select transistors GST1, GST2, etc. In addition, a low voltage level, such as 1.5V, is applied to the common source line CSL. Also, a low voltage, such as a ground voltage GND or 0V, is applied to the pocket well, in this example, a pocket p-type well, of the device.

Further, the first voltage, in this example the Vpass voltage, can be applied to the word lines WL[l+1] . . . WL[n] connected to the gates of the memory cell transistors MC1[$i$+1] . . . MC1[$n$] in series between the selected memory cell transistor MC1[$i$] and the at least one string select transistors SST1[0], SST1[1], SST1[2]. The second voltage, in this example 0V, can be applied to the word lines WL[0] . . . WL[i−2] connected to the gates of the memory cell transistors MC1[0] . . . MC1[$i$−2] in series between the neighboring memory cell transistor MC1[$i$−1] and the at least one ground select transistors GST1.

Figure 2:
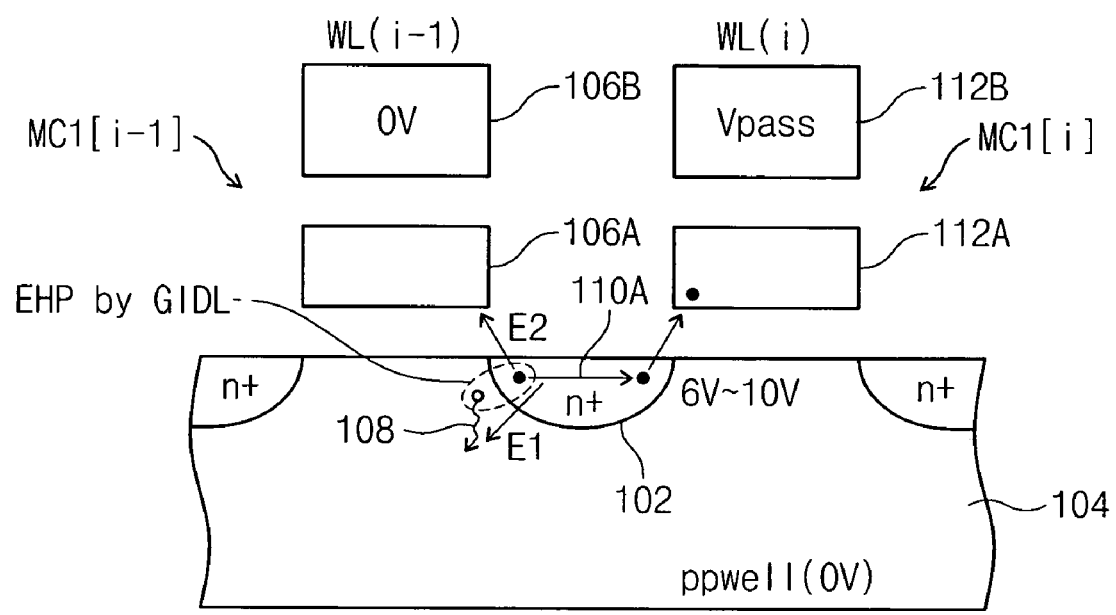
FIG. 2 is a cross-sectional illustration of neighboring memory cell transistors $MC1[i-1]$ and $MC1[i]$ of a common cell during a memory cell programming operation under the GIDL-like effect, in accordance with embodiments of the present invention.

The interaction of the GIDL-like effect in accordance with embodiments of the present invention is illustrated in the cross-sectional diagram of FIG. 2. FIG. 2 is a cross-sectional illustration of neighboring memory cell transistors MC1[$i$−1] and MC1[$i$] of a common memory cell string during a memory cell programming operation under the GIDL-like effect, in accordance with embodiments of the present invention. Under this effect, when the distance between the selected memory cell transistor MC1[$i$] and the neighboring memory cell transistor MC1[$i$−1] is very small, and when the difference between the first voltage Vpass and the second voltage 0V is large, for example, 10V, the resulting electric field between the gates of the selected memory cell transistor MC1[i] and the neighboring memory cell transistor MC1[i−1] is large. A first electric field E1 is present between the n+ depletion region 102 formed in the pocket p-well PPW 104 of the device substrate and the pocket p-well PPW 104. A second electric field E2 is present between the pocket p-well PPW 104 and the charge storage layer 106A and control gate 106B of the neighboring memory cell transistor MC1[i−1]. As a result, electron-hole pairs EHP are generated in the n+ depletion region 102 formed in the pocket p-well PPW 104 of the device substrate. The holes 108 of the electron-hole pairs EHP migrate into the pocket p-well PPW 104 as shown. The electrons 110A of the electron-hole pairs EHP accelerate through the n+ depletion region 102 between the charge storage layers 106A, 112A and control gates 106B, 112B of the neighboring transistors MC1[i−1], MC[i]. The electrons 110A continue to accelerate 110B and rise into the charge storage layer 112A of the selected memory cell transistor MC1[i], thereby programming the selected memory cell transistor MC1[i].

Referring to FIG. 1B, the erase and read operations of memory cells of the memory cell strings are performed by applying voltages in a manner similar to the conventional processes. Accordingly, detailed description thereof will be omitted herein.

FIG. 3A is a schematic diagram of a memory cell array circuit illustrating a memory cell programming operation in accordance with an embodiment of the present invention. FIG. 3B illustrates the voltage potential with respect to position at various positions along a channel of a selected cell string, in accordance with an embodiment of the present invention. FIG. 3C illustrates the lateral electric field with respect to position at various positions along a channel of a cell string, in accordance with an embodiment of the present invention.

Referring to FIGS. 3A-3C, a programming operation is performed on a selected memory cell MC1[i] of a selected cell string 20A. Accordingly, a relatively high first voltage Vpass is applied to the selected word line WL[i] connected to the control gate of the selected memory cell MC1[i], while a relatively low second voltage 0V is applied to the neighboring word line WL[i−1] connected to the control gate of the neighboring memory cell MC1[i−1]. In this manner, a large electric field $E_{102}$ is present in the channel region of the selected cell string 20A between the selected memory cell MC1[i] and the neighboring memory cell MC1[i−1]. As described above, the presence of the electric field $E_{102}$ at this region causes the acceleration of electrons toward the charge storage layer of the selected memory cell transistor MC1[i] thereby programming the selected memory cell transistor MC1[i] in accordance with the GIDL-like effect.

The GIDL-like effect of the programming operation is enhanced by further application of the first voltage Vpass as shown in FIGS. 3A-3C to the word lines WL[1+1] ... WL[n] connected to the gates of the memory cell transistors MC1[i+1] ... MC1[n] in series between the selected memory cell transistor MC1[i] and the at least one string select transistors SST1[0], SST1[1], SST1[2]. Also, the second voltage 0V is likewise applied to the word lines WL[0] ... WL[i−2] connected to the gates of the memory cell transistors MC1[0] ... MC1[i−2] in series between the neighboring memory cell transistor MC1[i−1] and the at least one ground select transistors GST1.

Multiple string select transistors SST1[0], SST1[1], SST1[2], in this case three string select transistors SST1, are positioned in each cell string 20A, 20B, between the uppermost memory cell transistor MC1[n] and the bit line BLi. In accordance with the programming operation of other embodiments of the present invention, various step voltages Vstep0, Vstep1, Vstep2 are applied to the string select lines SSL0, SSL1, SSL2 connected to the string select transistors SST1[0], SST1[1], SST1[2]. In this manner, the electric field $E_{104a}$ present between the gate of the uppermost memory cell transistor MC1[n] and the gate of the third string select transistor SST1[2] is sufficiently small so as to avoid GIDL-like effect programming of the uppermost memory cell transistor MC1[n] during programming of the selected memory cell transistor MC1[i].

To accomplish this, a stepwise reduction of the step voltage Vstep0, Vstep1, Vstep2 can be applied to the gates of the string select transistors. For example, assuming that a Vcc level voltage is applied to the bit line BLi connected to the selected memory cell string 20A during a programming operation of memory cell MC1[i], and assuming a Vpass voltage of about 6-10 V is applied to the selected word line WL[i] and other word lines positioned between the selected word line WL[i] and the uppermost word line WL[n], step voltages in the range between about the Vcc level and the Vpass level and progressively increasing between the Vcc level and the Vpass level can be applied to the string select lines SSL0, SSL1, SSL2. Assuming a Vcc voltage level of about 2V and a Vpass level of about 10V, a step voltage Vstep0 of 4V can be applied to the first string select line SSL0, a step voltage Vstep1 of 6V can be applied to the second string select line SSL1, and a step voltage Vstep2 of 8V can be applied to the third string select line SSL2. In this manner, the resulting electric field $E_{104c}$ between the first and second string select transistors SST1[0], SST1[1], the resulting electric field $E_{104b}$ between the second and third string select transistors SST1[1], SST1[2], and the resulting electric field $E_{104a}$ between the third string select transistor SST1[2] and the uppermost memory cell transistor MC1 [n] are smaller that the electric field E102 between the selected memory cell transistor MC1[i] and the neighboring memory cell transistor MC1[i−1]. Therefore, the electric field $E_{104a}$ present between the gate of the uppermost memory cell transistor MC1[n] and the gate of the third string select transistor is insufficient for causing GIDL-like effect programming of the uppermost memory cell transistor MC1[n] during programming of the selected memory cell transistor MC1[i].

An advantage of the programming operation in accordance with embodiments of the present invention lies in that programming of memory cells can be achieved through application of a much lower voltage than that of the conventional programming voltage Vpgm. In contemporary devices, a programming voltage Vpgm on the order of 20V is required to achieve cell programming. In contrast, application of the much lower Vpass voltage on the order of 6-10V is needed for programming memory cells in accordance with embodiments of the present invention. This lower voltage required for programming reduces the power consumption of the resulting device, and simplifies power circuitry required for driving the device.

The conventional programming operation requires a programming voltage on the order of 20V in order to induce Fowler-Nordheim (FN) tunneling, the phenomenon by which programming occurs in conventional non-volatile memory devices. Therefore, further scaling down of the programming voltage Vpgm is not available in such devices. In contrast, the mechanism of the programming operation in accordance with embodiments of the present invention can be scaled down, since the programming operation in accordance with embodiments of the present invention is based on the electric field generated between gates that causes the acceleration of electrons between gates. The applied electric field is based both on the relative difference in voltage, and on the distance between the gates; therefore, as the devices are further integrated, causing the cells and their control gates to be more closely positioned, the first and second applied voltages used for the programming operation can likewise be scaled down, and yet still result in GIDL-like electron acceleration between the cells.

In addition, the conventional programming operation requires a channel boosting voltage on the order of 8V to prevent memory cells of neighboring cell strings from being inadvertently programmed. In contrast, scaling of the channel boosting voltage in accordance with embodiments of the present invention is possible. This is because embodiments of the present invention adopt a programming operation which depends on the strength of the applied electric field and not on the applied voltage level. The more a device or a cell becomes more scaled down, the shorter the distance between the adjacent word lines becomes. Therefore, a higher lateral electric field can be obtained without applying a larger voltage. In other words, where the distance between adjacent cells is decreased, a lower voltage can be applied to achieve the same results.

Since a lower voltage can be applied, the depth of the trench between devices can be reduced, since, with the lower applied voltage, the depletion region of the channel is shallower. Also, with reduced gate-to-gate spacing, the gate voltage is reduced, along with the channel boosting voltage and the depletion length. Therefore, the trench depth can be reduced. This is in contrast with conventional programming operation approaches where further scaling of the trench depth is not available, since the channel boosting voltage is fixed.

Further, under the conventional programming operation, wordline-to-wordline voltage breakdown is an issue with further integration of devices, since a voltage difference of at least 10V is sustained between neighboring word lines during a programming operation. In contrast, since the voltage applied to neighboring word lines can be scaled down along with further reduction of the size of memory cells, this issue of wordline-to-wordline voltage breakdown can be addressed in accordance with embodiments of the present invention Further, in the present embodiments, more than one string select transistor SST1 can be positioned between the uppermost memory cell transistor MC1[n] and the bit line BLi to control the gradual lowering of the applied electric field in a relatively simple manner.

In sum, with further integration of the size of memory cells in cell strings, programming operations under the conventional approaches are limited by the voltage levels required for the FN tunneling phenomenon to occur. In contrast, programming operations in accordance with embodiments of the present invention open up the possibility of further scaling of the resulting devices with regard to cell size and applied voltage levels. This leads to devices of increased density with reduced power consumption and therefore greater efficiency.

Figure 4A:
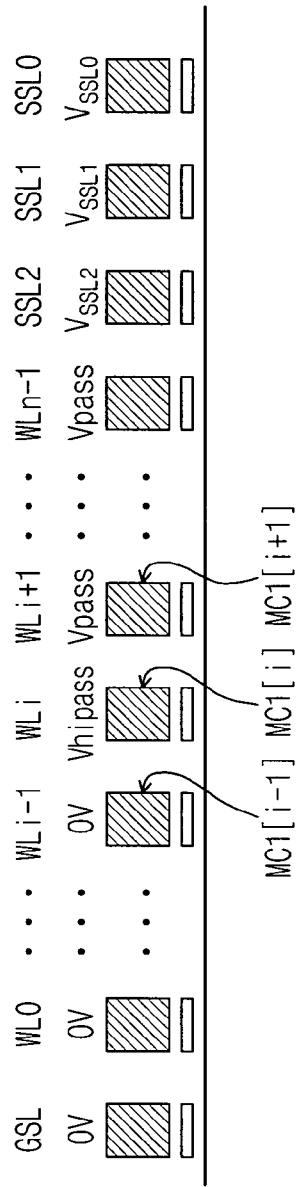
FIG. 4A is a cross-sectional illustration of a cell string of a memory cell array circuit illustrating a memory cell programming operation in accordance with another embodiment of the present invention.
Figure 4B:
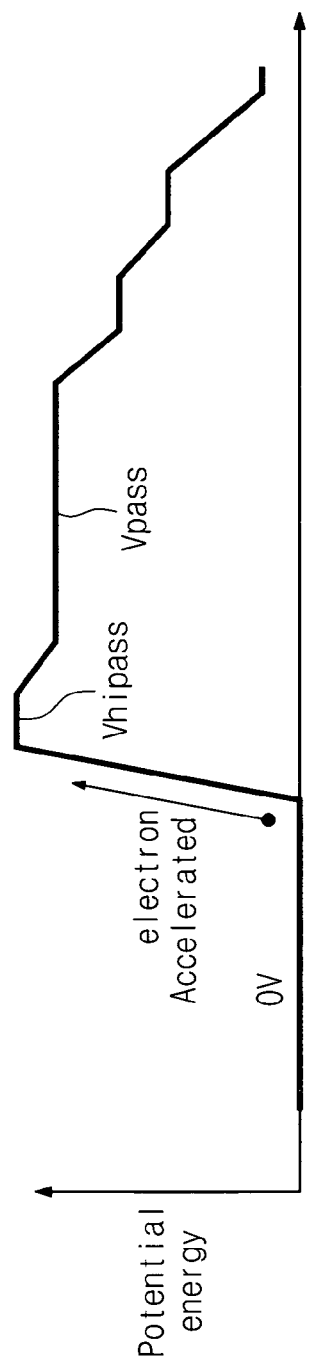
FIG. 4B illustrates the voltage potential with respect to position at various positions along the channel of the cell string of FIG. 4A, in accordance with another embodiment of the present invention.
Figure 4C:
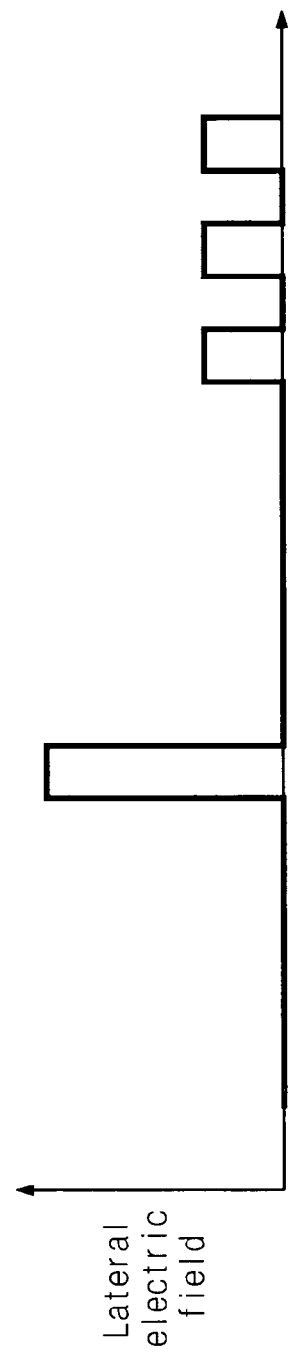
FIG. 4C illustrates the lateral electric field with respect to position at various positions along the channel of the cell string of FIG. 4A, in accordance with another embodiment of the present invention.

FIG. 4A is a cross-sectional illustration of a cell string of a memory cell array circuit illustrating a memory cell programming operation in accordance with another embodiment of the present invention. FIG. 4B illustrates the voltage potential with respect to position at various positions along the channel of the cell string of FIG. 4A, in accordance with another embodiment of the present invention. FIG. 4C illustrates the lateral electric field with respect to position at various positions along the channel of the cell string of FIG. 4A, in accordance with another embodiment of the present invention.

In the embodiment of FIGS. 4A-4C, it can be seen that the word line WL[i] connected to the memory cell transistor selected for programming MC1[i] has applied thereto a first voltage at a voltage level Vhipass that is slightly higher than the voltage level Vpass applied to the word lines WL[i+1] . . . WL[n] connected to the gates of the memory cell transistors MC1[i+1] . . . MC1[n] in series between the selected memory cell transistor MC1[i] and the at least one string select transistors SST1[0], SST1[1], and SST1[2]. For example, the Vhipass voltage level can be about 0.5 V~2.0 V greater in voltage level than the Vpass voltage level. The remaining voltages applied to the ground select line GSL, to the unselected word lines WL[0] . . . WL[i−1] in series between the ground select line GSL and the selected word line WL[i], and to the string select lines SSL0, SSL1, SSL2 are all similar to the voltages applied in the example embodiment described above in connection with FIGS. 3A-3C.

In the embodiment of FIGS. 4A-4C, the application of the slightly higher voltage level Vhipass to the word line WL[i] connected to the selected memory cell MC1[i] further increases the injection efficiency of electrons under the GIDL-like effect, since the slightly increased voltage further increases the applied magnetic field between the selected memory cell MC1[i] and the neighboring memory cell MC1[i−1].

Figure 5A:
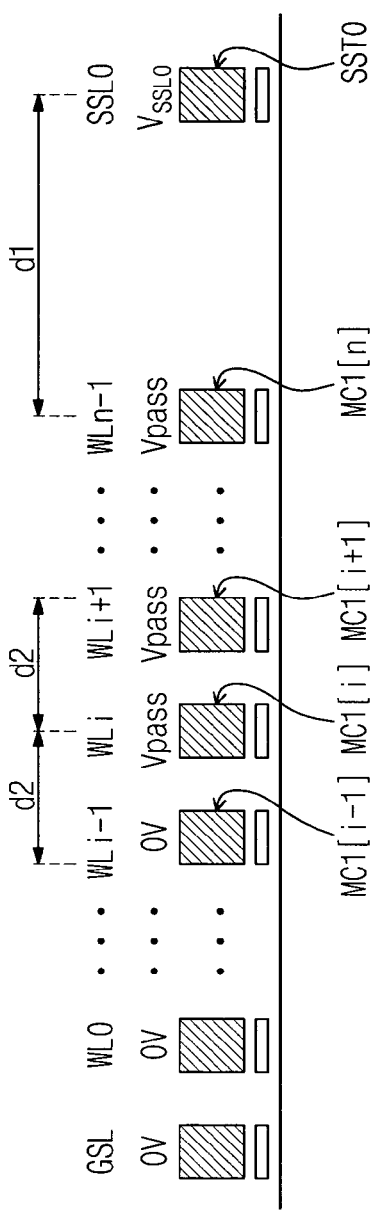
FIG. 5A is a cross-sectional illustration of a cell string of a memory cell array circuit illustrating a memory cell programming operation in accordance with another embodiment of the present invention.
Figure 5B:
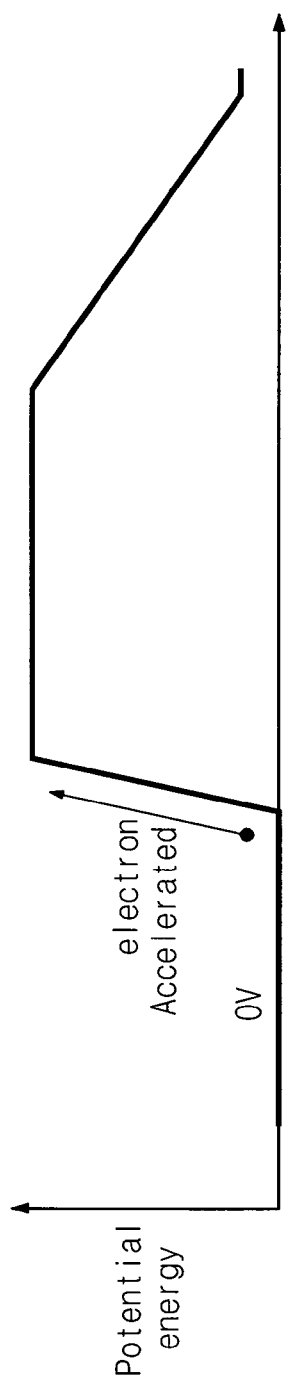
FIG. 5B illustrates the voltage potential with respect to position at various positions along the channel of the cell string of FIG. 5A, in accordance with another embodiment of the present invention.
Figure 5C:
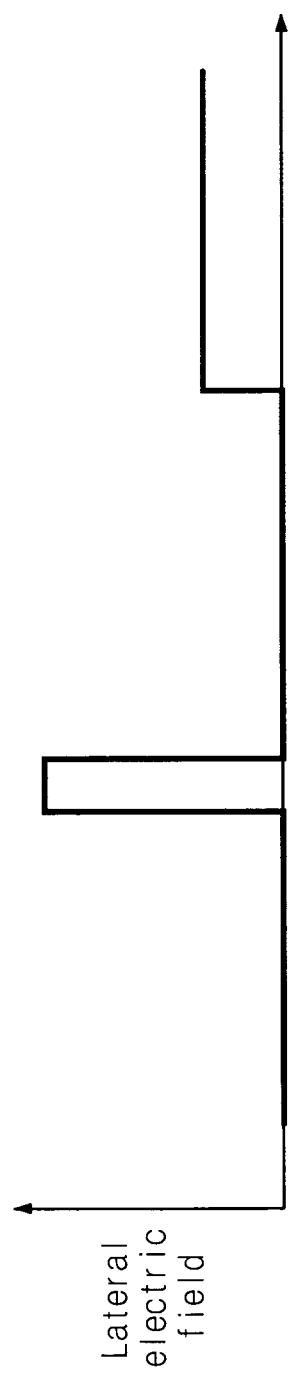
FIG. 5C illustrates the lateral electric field with respect to position at various positions along the channel of the cell string of FIG. 5A, in accordance with another embodiment of the present invention.

FIG. 5A is a cross-sectional illustration of a cell string of a memory cell array circuit illustrating a memory cell programming operation in accordance with another embodiment of the present invention. FIG. 5B illustrates the voltage potential with respect to position at various positions along the channel of the cell string of FIG. 5A, in accordance with another embodiment of the present invention. FIG. 5C illustrates the lateral electric field with respect to position at various positions along the channel of the cell string of FIG. 5A, in accordance with another embodiment of the present invention.

In the embodiment of FIGS. 5A-5C, it can be seen that a single string select transistor SST0 is provided in the cell string at a position that is relatively spaced apart in distance d1 from the uppermost memory cell transistor MC1[n]. The distance d1 between the string select transistor SST0 and the uppermost memory cell transistor MC1[n] is greater than the regular distance d2 between neighboring memory cell transistors. As a result of the distance d1, there is a gradual drop in potential energy in the channel region of the cell string between the string select transistor SST0 and the uppermost memory cell transistor MC1[n]; thus, the electric field is relatively low in that region. With low electric field, inadvertent electron acceleration as a result of the GIDL-like effect into the charge storage layer of the uppermost memory cell transistor MC1[n] is minimized.

The remaining voltages applied to the ground select line GSL, to the unselected word lines WL[0] . . . WL[i−1] in series between the ground select line GSL and the selected word line WL[i], to the selected word line WL[i] and to word lines WL[i+1] . . . WL[n] in series between the selected word line WL[i] and the string select line SSL0 are all similar to the voltages applied in the example embodiment described above in connection with FIGS. 3A-3C. The voltage Vstep0 applied to the string select line SSL0 can be a relatively low voltage, for example similar to the voltage Vstep0 applied in the example embodiment described above in connection with FIGS. 3A-3C.

In the embodiment of FIGS. 5A-5C, the positioning of the string select transistor SST0 at the relatively increased distance d1 from the uppermost memory cell transistor MC1[n] to give the effect of a reduced lateral electric field in that region can be combined with the introduction of multiple string select transistors SST0, SST1, SST2 as described above in connection with the embodiments of FIGS. 3A-3C and FIGS. 4A-4C to provide the advantages of both effects; namely, the stepping down of the potential in the channel region as a result of the application of multiple step down voltages, and the reduced electric field in the channel region as a result of the increased distance between the uppermost memory cell transistor MC1[n] and the string select transistors SST0, SST1, SST2 and any increased distance between respective ones of the string select transistors SST0, SST1, SST2.

Figure 6A:
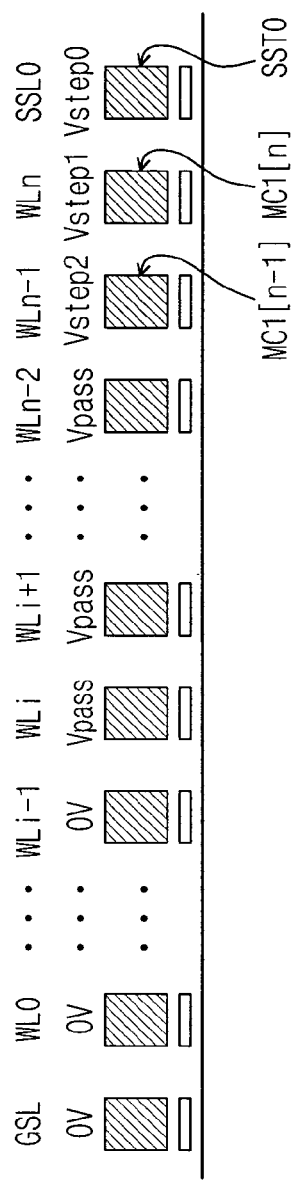
FIG. 6A is a cross-sectional illustration of a cell string of a memory cell array circuit illustrating a memory cell programming operation in accordance with another embodiment of the present invention.
Figure 6B:
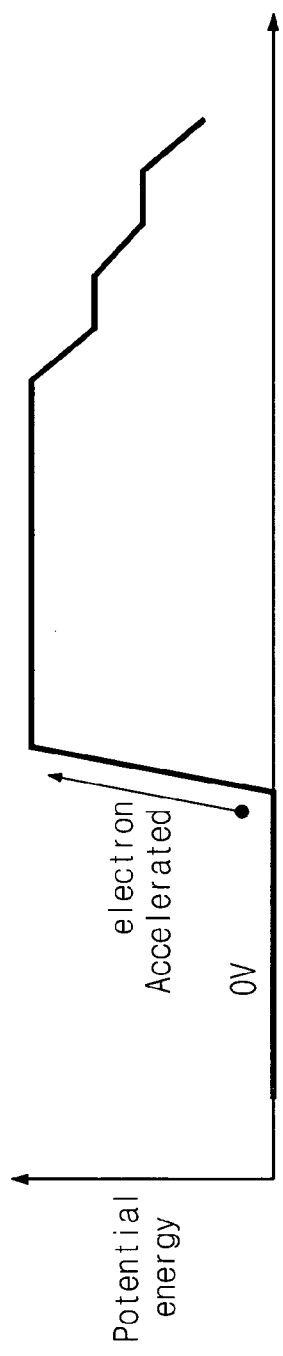
FIG. 6B illustrates the voltage potential with respect to position at various positions along the channel of the cell string of FIG. 6A, in accordance with another embodiment of the present invention.
Figure 6C:
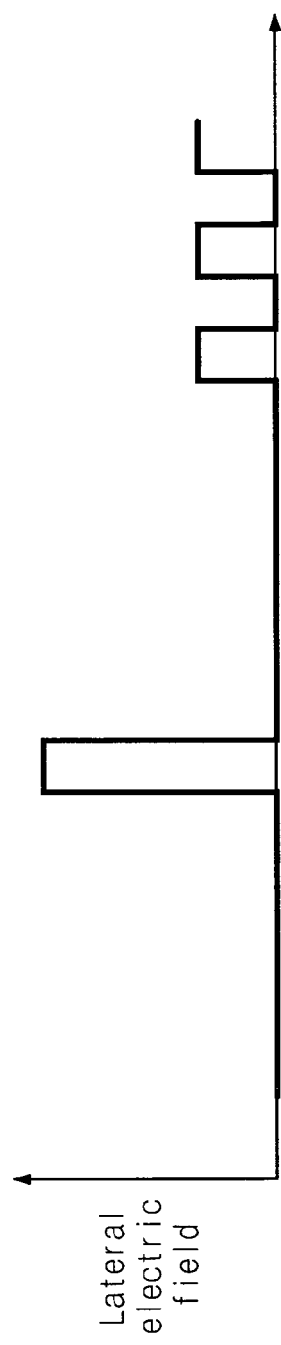
FIG. 6C illustrates the lateral electric field with respect to position at various positions along the channel of the cell string of FIG. 6A, in accordance with another embodiment of the present invention.

FIG. 6A is a cross-sectional illustration of a cell string of a memory cell array circuit illustrating a memory cell programming operation in accordance with another embodiment of the present invention. FIG. 6B illustrates the voltage potential with respect to position at various positions along the channel of the cell string of FIG. 6A, in accordance with another embodiment of the present invention. FIG. 6C illustrates the lateral electric field with respect to position at various positions along the channel of the cell string of FIG. 6A, in accordance with another embodiment of the present invention.

In the embodiment of FIGS. 6A-6C, it can be seen that only a single string select transistor SST0 is provided and that the distance between the string select transistor SST0 and the uppermost memory cell transistor MC1[n] is similar to or the same as the regular distance between neighboring memory cell transistors MC1. It can also be seen that step voltages Vstep0, Vstep1, Vstep2, etc. are applied to the gates of the end transistors of the cell string. However, in this embodiment, the step voltages are applied to the gates of the string select transistor SST0 and the neighboring memory cells MC1[n], MC1[n−1]. In this manner, the memory cell transistors MC1[n], MC1[n−1] operate in the same manner as the string select transistors SST1, SST2 of the embodiment described above in connection with FIGS. 3A-3C and FIGS. 4A-4C.

In this example embodiment, the voltages applied to the ground select line GSL, to the unselected word lines WL[0] . . . WL[i−1] in series between the ground select line GSL and the selected word line WL[i], and to certain ones of the word lines and to the string select line SSL0 are all similar to the voltages applied in the example embodiment described above in connection with FIGS. 3A-3C.

Figure 7A:
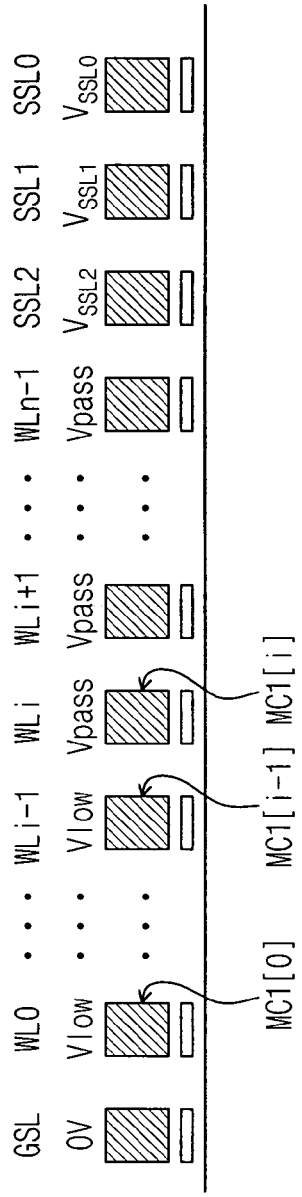
FIG. 7A is a cross-sectional illustration of a cell string of a memory cell array circuit illustrating a memory cell programming operation in accordance with another embodiment of the present invention.
Figure 7B:
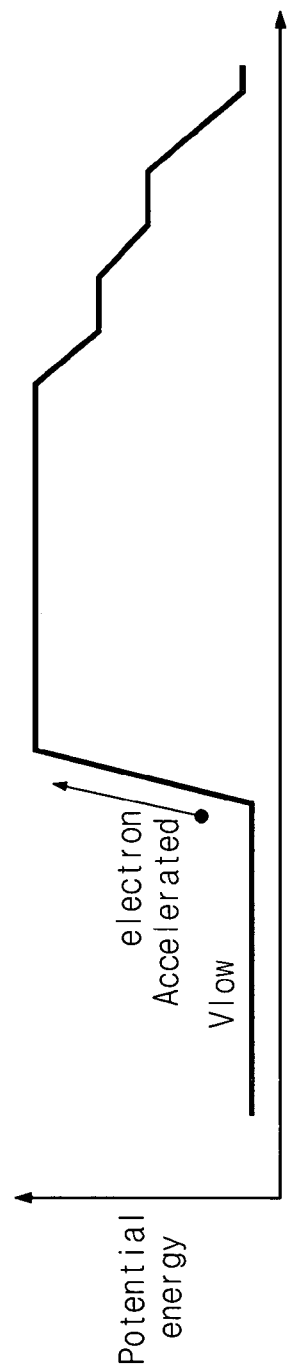
FIG. 7B illustrates the voltage potential with respect to position at various positions along the channel of the cell string of FIG. 7A, in accordance with another embodiment of the present invention.
Figure 7C:
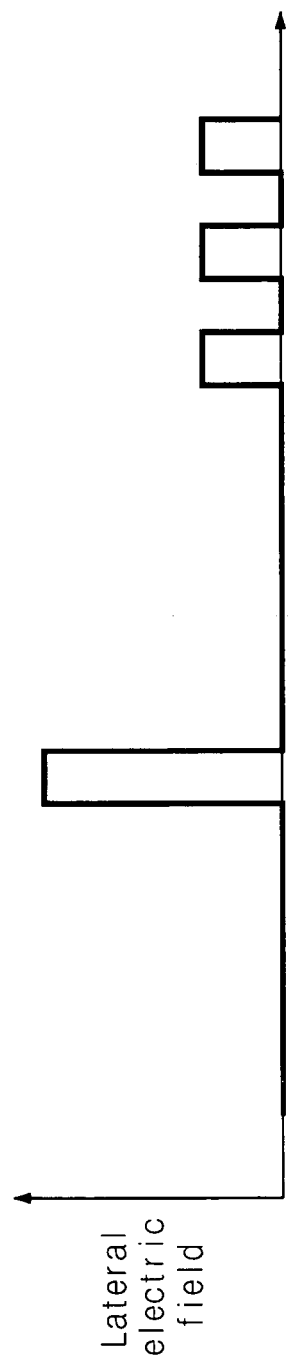
FIG. 7C illustrates the lateral electric field with respect to position at various positions along the channel of the cell string of FIG. 7A, in accordance with another embodiment of the present invention.

FIG. 7A is a cross-sectional illustration of a cell string of a memory cell array circuit illustrating a memory cell programming operation in accordance with another embodiment of the present invention. FIG. 7B illustrates the voltage potential with respect to position at various positions along the channel of the cell string of FIG. 7A, in accordance with another embodiment of the present invention. FIG. 7C illustrates the lateral electric field with respect to position at various positions along the channel of the cell string of FIG. 7A, in accordance with another embodiment of the present invention.

In the embodiment of FIGS. 7A-7C, it can be seen that voltage Vlow applied to the unselected word line WL[i−1] connected to the neighboring memory cell MC1[i−1] and the voltage Vlow applied to the unselected word lines WL[0] . . . WL[i−2] connected to the memory cells MC1[0] . . . MC1[i−2] in series between the ground select transistor and the neighboring memory cell MC1[i−1] is not the ground voltage 0 V, as applied in the example embodiment described above in connection with FIG. 3A-3C. Instead, the voltage applied to the word lines WL[0] . . . WL[i−1] is a low voltage Vlow that is greater than the ground voltage.

In this example embodiment, the remaining voltages applied to the ground select line GSL, to the selected word line WL[i] and to the unselected word lines WL[i+1] . . . WL[n] in series between the selected word line WL[i] and to the string select lines SSL2, SSL1, SSL0 are all similar to the voltages applied in the example embodiment described above in connection with FIGS. 3A-3C. The voltage Vstep0 applied to the string select line SSL0 can be a relatively low voltage, for example similar to the voltage Vstep0 applied in the example embodiment described above in connection with FIGS. 3A-3C.

Figure 8A:
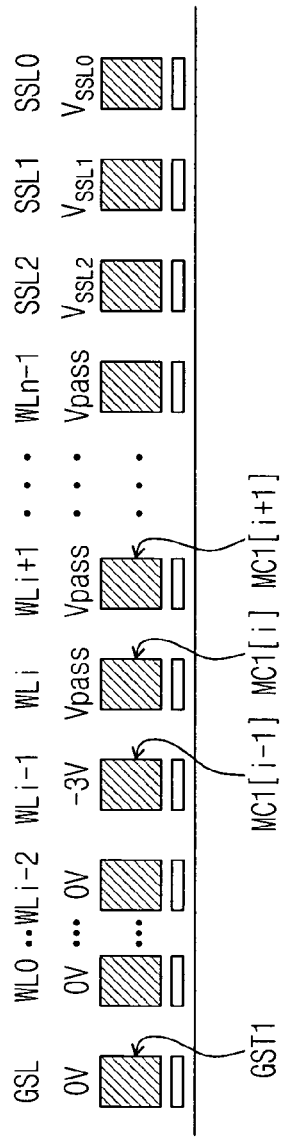
FIG. 8A is a cross-sectional illustration of a cell string of a memory cell array circuit illustrating a memory cell programming operation in accordance with another embodiment of the present invention.
Figure 8B:
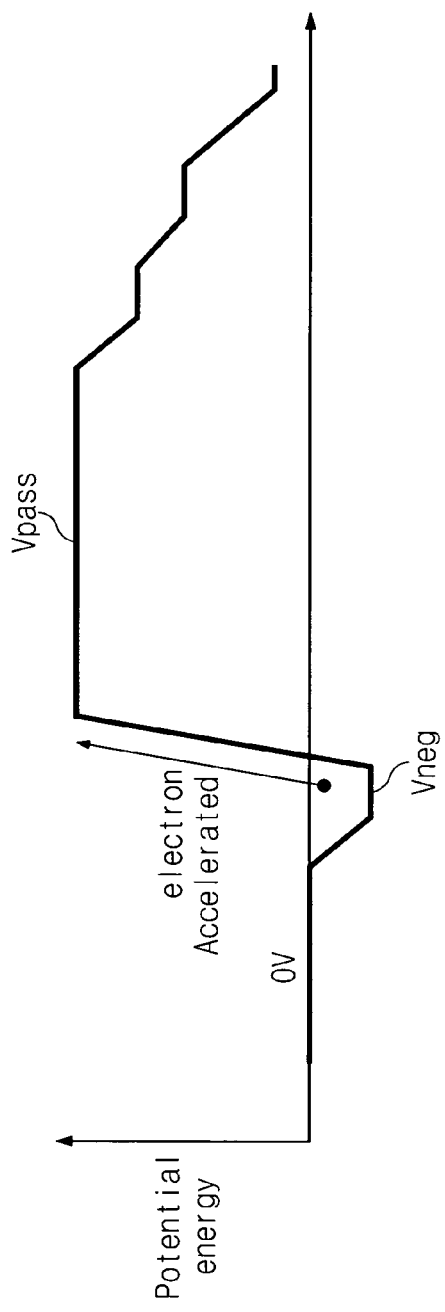
FIG. 8B illustrates the voltage potential with respect to position at various positions along the channel of the cell string of FIG. 8A, in accordance with another embodiment of the present invention.
Figure 8C:
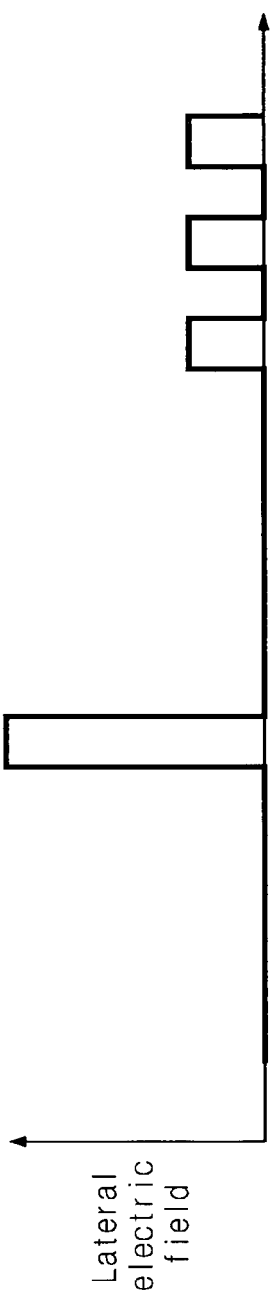
FIG. 8C illustrates the lateral electric field with respect to position at various positions along the channel of the cell string of FIG. 8A, in accordance with another embodiment of the present invention.

FIG. 8A is a cross-sectional illustration of a cell string of a memory cell array circuit illustrating a memory cell programming operation in accordance with another embodiment of the present invention. FIG. 8B illustrates the voltage potential with respect to position at various positions along the channel of the cell string of FIG. 8A, in accordance with another embodiment of the present invention. FIG. 8C illustrates the lateral electric field with respect to position at various positions along the channel of the cell string of FIG. 8A, in accordance with another embodiment of the present invention.

In the embodiment of FIGS. 8A-8C, it can be seen that the neighboring word line WL[i−1] connected to the unselected memory cell transistor MC1[i−1] neighboring the memory cell selected for programming MC1[i] has applied thereto a second voltage at a voltage level Vneg that is slightly less than the voltage level, in this example 0V, applied to the word lines WL[0] . . . WL[i−2] connected to the gates of the memory cell transistors MC1[0] . . . MC1[i−2] in series between the unselected neighboring memory cell transistor MC1[i−1] and the ground select transistor GST1. For example, the Vneg voltage level can be about −3V, or about 3V less than the voltage level applied to the word lines WL[0] . . . WL[i−2]. The remaining voltage levels applied to the ground select line GSL, to the unselected word lines WL[0] . . . WL[i−2] in series between the ground select line GSL and the word line WL[i−1] neighboring the selected word line WL[i], to the selected word line WL[i], to the unselected word lines WL[i+1] . . . WL[n] in series between the selected word line WL[i] and the string select lines SSL2, SSL1, SSL0, and to the string select lines SSL0, SSL1, SSL2 are all similar to the voltages applied in the example embodiment described above in connection with FIGS. 3A-3C.

In the embodiment of FIGS. 8A-8C, the application of the slightly lower voltage level Vneg to the word line WL[i−1] connected to the unselected memory cell MC1[i−1] neighboring the selected word line WL[i] connected to the selected memory cell MC1[i] further enhances the injection efficiency of electrons under the GIDL-like effect, since the slightly lower voltage level Vneg further increases the applied magnetic field between the neighboring memory cell MC1[i−1] and the selected memory cell MC1[i].

Figure 9A:
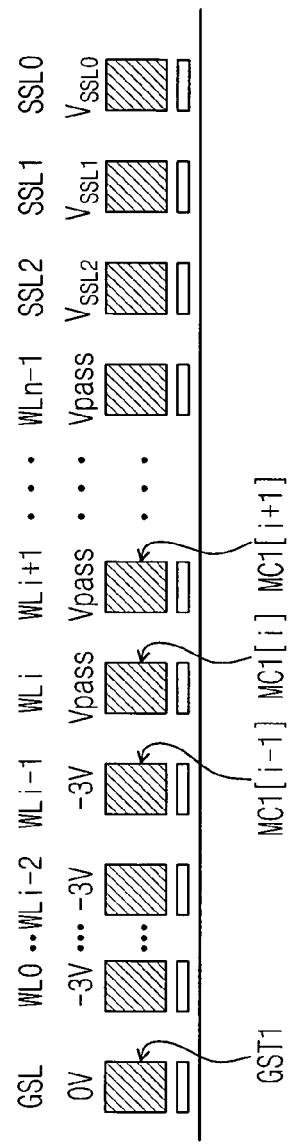
FIG. 9A is a cross-sectional illustration of a cell string of a memory cell array circuit illustrating a memory cell programming operation in accordance with another embodiment of the present invention.
Figure 9B:
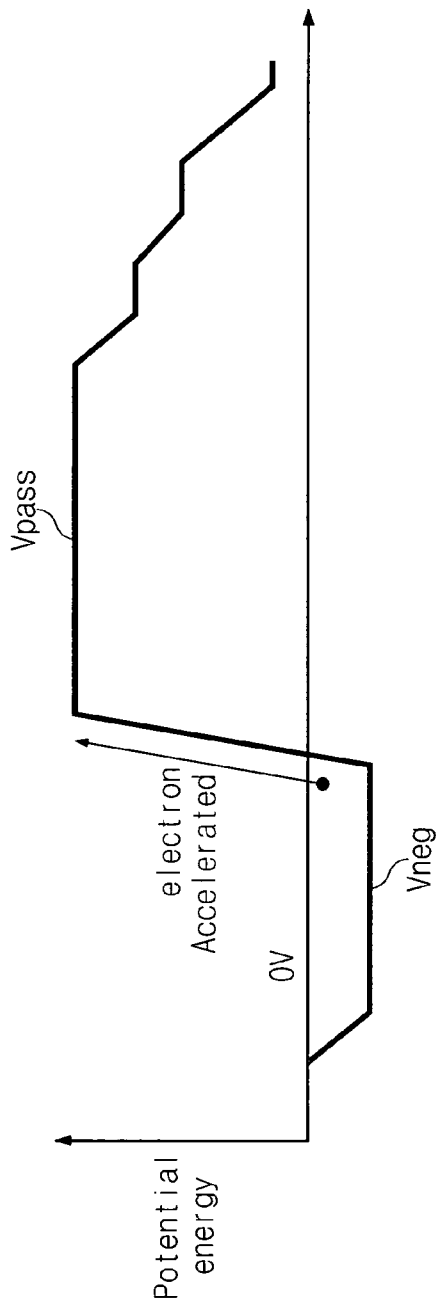
FIG. 9B illustrates the voltage potential with respect to position at various positions along the channel of the cell string of FIG. 9A, in accordance with another embodiment of the present invention.
Figure 9C:
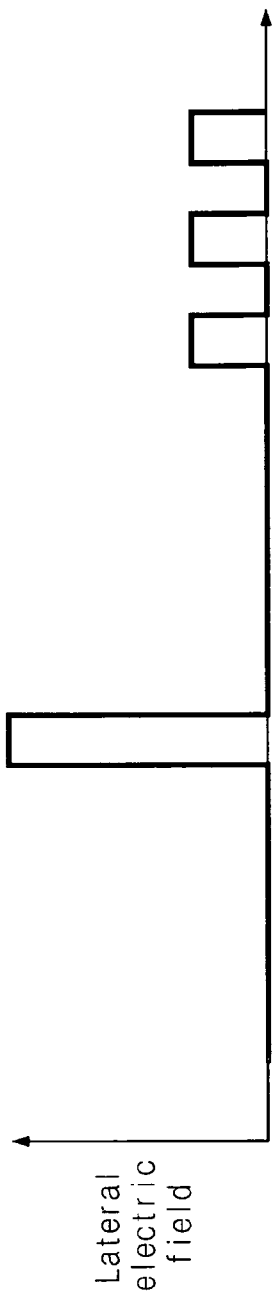
FIG. 9C illustrates the lateral electric field with respect to position at various positions along the channel of the cell string of FIG. 9A, in accordance with another embodiment of the present invention.

FIG. 9A is a cross-sectional illustration of a cell string of a memory cell array circuit illustrating a memory cell programming operation in accordance with another embodiment of the present invention. FIG. 9B illustrates the voltage potential with respect to position at various positions along the channel of the cell string of FIG. 9A, in accordance with another embodiment of the present invention. FIG. 9C illustrates the lateral electric field with respect to position at various positions along the channel of the cell string of FIG. 9A, in accordance with another embodiment of the present invention.

In the embodiment of FIGS. 9A-9C, it can be seen that the neighboring word line WL[i−1] connected to the unselected memory cell transistor MC1[i−1] neighboring the memory cell selected for programming MC1[i] has applied thereto a second voltage at a voltage level Vneg that is a negative voltage level, in this example −3V, in a manner similar to the embodiment of FIGS. 8A-8C described above. However, in the present embodiment of FIGS. 9A-9C, the negative voltage level Vneg is further applied to other unselected word lines WL[0] ... WL[i−2] connected to the gates of the memory cell transistors MC1[0] ... MC1[i−2] in series between the unselected neighboring memory cell transistor MC1[i−1] and the ground select transistor GST1. For example, the Vneg voltage level can be about −3V, or about 3V less than the voltage level applied to the ground select transistor GST1. The remaining voltage levels applied to the ground select line GSL, to the selected word line WL[i], to the unselected word lines WL[i+1] ... WL[n] in series between the selected word line WL[i] and the string select lines SSL2, SSL1, SSL0, and to the string select lines SSL0, SSL1, SSL2 are all similar to the voltages applied in the example embodiment described above in connection with FIGS. 3A-3C.

In the embodiment of FIGS. 9A-9C, the application of the slightly lower voltage level Vneg to the word line WL[i−1] connected to the unselected memory cell MC1[i−1] neighboring the selected word line WL[i] connected to the selected memory cell MC1[i] further enhances the injection efficiency of electrons under the GIDL-like effect, since the slightly lower voltage level Vneg further increases the applied magnetic field between the neighboring memory cell MC1[i−1] and the selected memory cell MC1[i].

Figure 10:
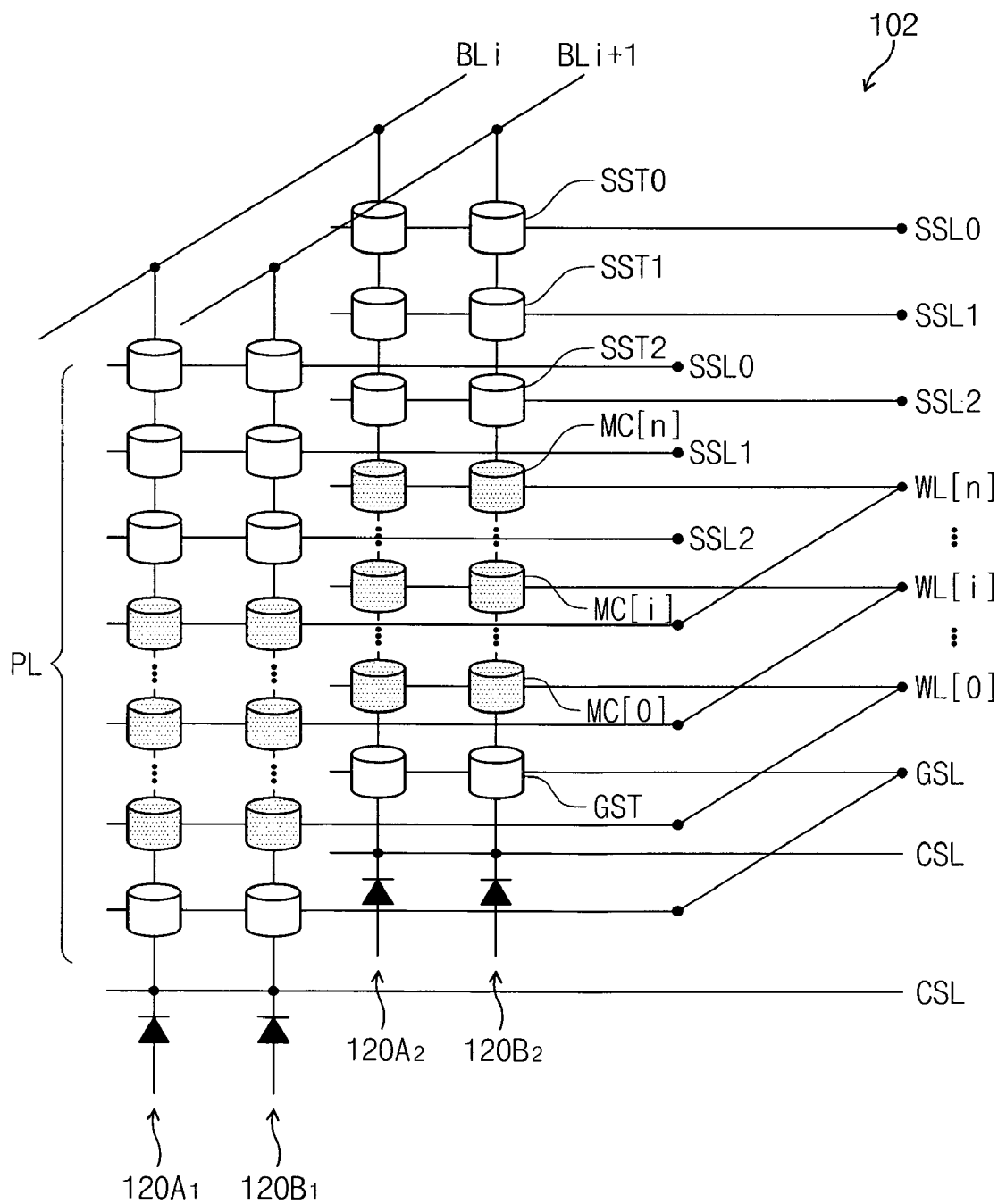
FIG. 10 is a perspective schematic diagram of a memory cell array circuit configured as a three-dimensional vertical channel memory device, in accordance with embodiments of the present invention.

FIG. 10 is a schematic diagram of a memory cell array circuit configured as a three-dimensional vertical channel memory device, in accordance with embodiments of the present invention. Referring to FIG. 10, in this example, a three-dimensional vertical channel memory device 102 includes a plurality of vertical channels, in a form of a pillar PL, or tube. In this case, the pillars PL extend in a vertical direction, and transistors formed are provided above and below the memory cells, forming cell strings 120A₁, 120A₂, 120B₁, 120B₂, .... In this example, the upper transistor of a cell string comprises the string select transistors SST0, SST1, SST2 and the lower transistor of a cell string comprises the ground select transistor GST. The memory cell transistors MC[0], ..., MC[i], MC[n] are positioned in the pillar PL between string select transistors SST0, SST1, SST2 and the ground select transistor GST. The tops of the pillars PL arranged in a first direction, for example a horizontal direction, are connected to each other along bit lines BLi, BLi+1. The bottoms of the pillars PL are connected to each other along a common source line CSL. Embodiments of the present invention described herein are also applicable to vertical channel memory devices and traditional, planar-type, memory devices.

Figure 11A:
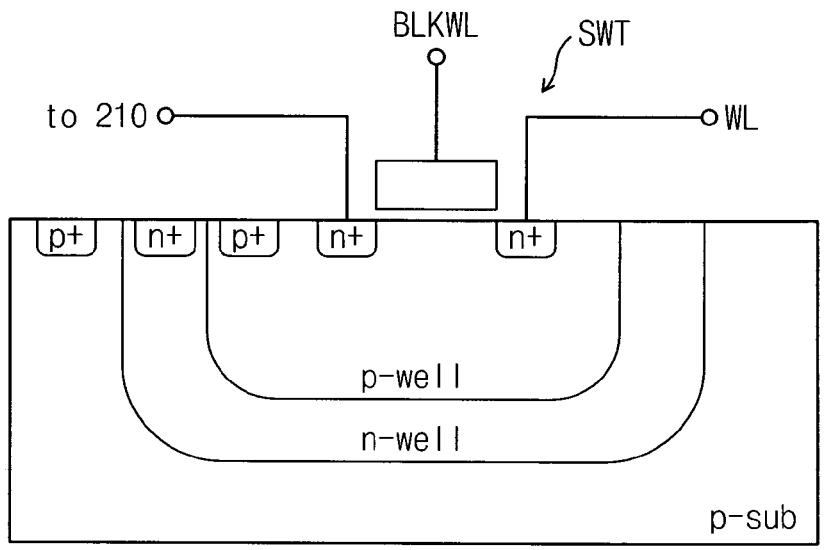
FIGS. 11A, 11B and 11C are cross-sectional schematic diagrams of transistor structures that can be used on the memory cell array circuit device for generating the Vpass voltage and the negative Vneg voltage applied in the embodiments of FIGS. 8 and 9, in accordance with embodiments of the present invention.
Figure 11B:
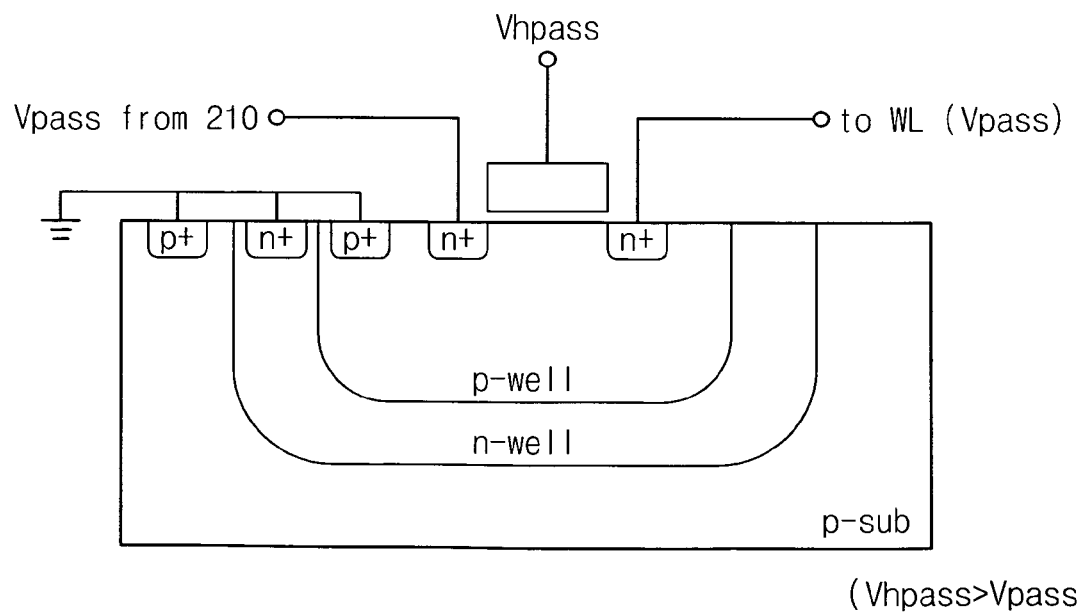
Figure 11C:
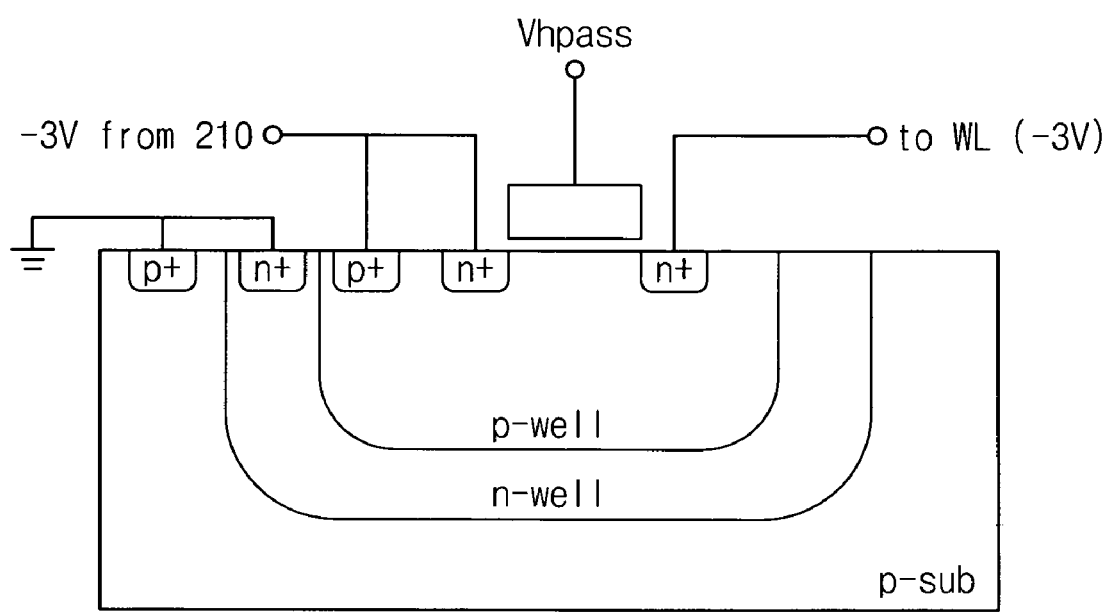
Figure 11D:
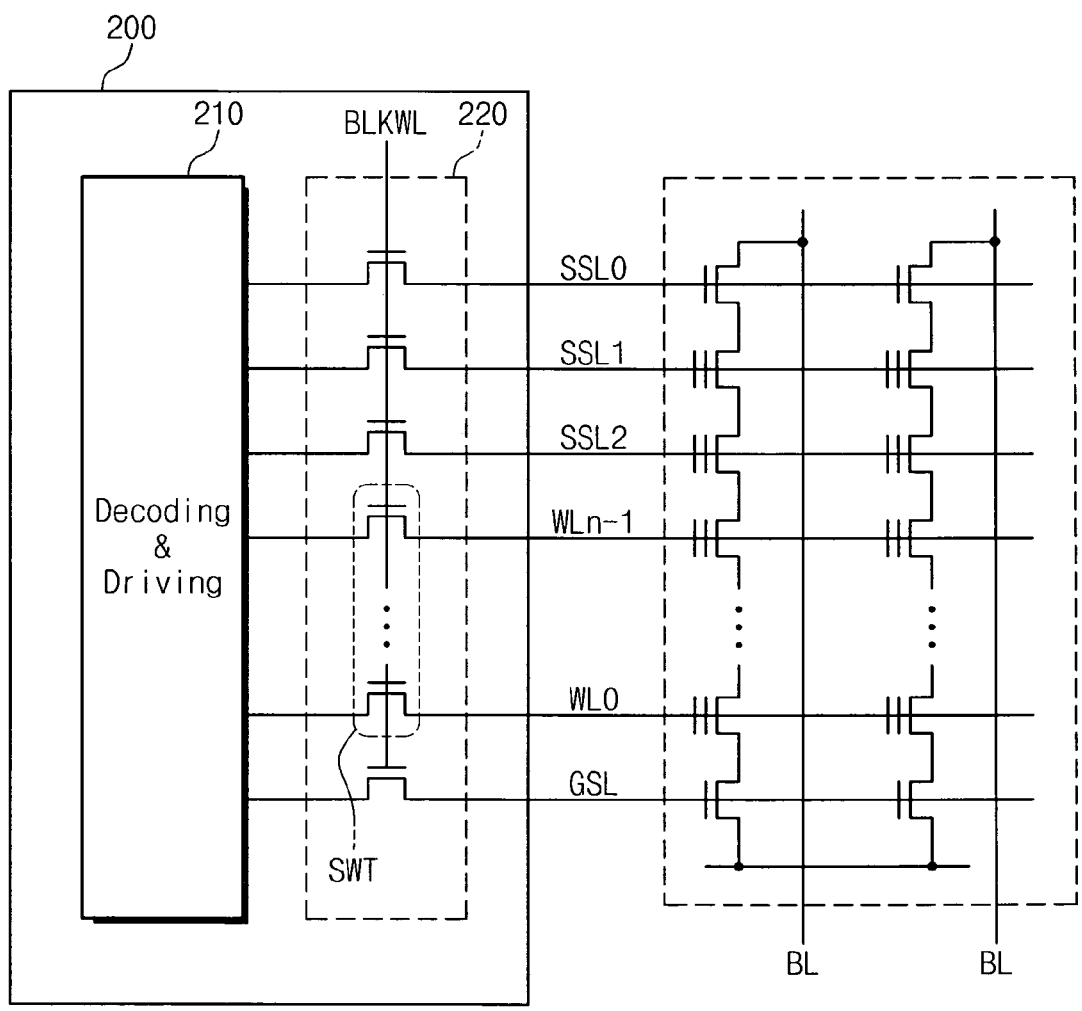
FIG. 11D is a schematic diagram of a row decoder and driving circuit used to generate the voltages applied to the gates of the cell string transistors, in accordance with embodiments of the present invention.

FIGS. 11A, 11B and 11C are cross-sectional schematic diagrams of transistor structures that can be used on the memory cell array circuit device for generating the Vpass voltage and the negative voltage Vneg applied in the embodiments of FIGS. 8 and 9, in accordance with embodiments of the present invention. FIG. 11D is a schematic diagram of a row decoder and driving circuit used to generate the voltages applied to the gates of the cell string transistors, in accordance with embodiments of the present invention.

Referring to FIG. 11D, a row decoder circuit 200 comprises a decoding and driving block 210 and circuitry for generating and transmitting high and negative voltage levels BLKWL, 220. The decoding and driving block 210 operates to drive selection lines SSL0, SSL1, SSL2, GSL and word lines WL0~WLn−1 by way of switching transistors SWT. The circuitry for transmitting high and negative voltage levels 220 comprises a plurality of switching transistors SWT. In order to apply a negative voltage Vneg to a word line, the corresponding switching transistor should be configured for transmitting negative voltage. In an embodiment, a switching transistor SWT that is able to transmit a negative voltage Vneg may be configured within the substrate as, for example, a triple-well structure. As illustrated in FIG. 11A, a switching transistor SWT is formed in p-type well, in turn formed in an outer n-type well. The n-type well is in turn formed in a p-type substrate. In this manner, circuitry for generating and transmitting a high and negative voltage can be formed.

FIG. 11B illustrates a condition whereby a pass voltage Vpass is provided from an external voltage source, while FIG. 11C shows a condition whereby a negative voltage Vneg is provided.

Referring to FIG. 11B, the p-substrate, the outer n-well and the p-well are grounded. A Vpass voltage is applied to the n+ source and Vhpass, which is sufficiently higher than Vpass so as to open the switching transistor, is applied to a gate.

FIG. 11C illustrates a condition whereby negative voltage Vneg can be generated, which is applicable, for example, to the embodiments of FIGS. 8 and 9. To generate a negative voltage, a structure having a p-type pocket well can be used. A p-type pocket well is a structure whereby a p-type well is confined within an n-type well, as shown. Without the presence of a p-type pocket well, when a negative voltage is applied, the negative voltage can leaks through the substrate. The p-type pocket well prevents current from flowing into the substrate. As described above in connection with FIGS. 8 and 9, the application of a negative voltage Vneg sharpens the slope of the electric field, thereby enhancing GIDL efficiency. A negative voltage equal to the negative voltage Vneg to be applied to the word line should be applied to the p-well as shown in order to prevent current leakage into the substrate. A ground voltage is applied to the p-type substrate and the outer n-type well for the same reason. The voltage Vhpass(−) is applied to the gate of the switching transistor for opening the switching transistor SWT. Depending on the application, the negative voltage can be in the rage of between about be −1V~−6V and Vhpass(−) may be same as or different from Vhpass, for example in the range of about 6V~20V.

Figure 12C:
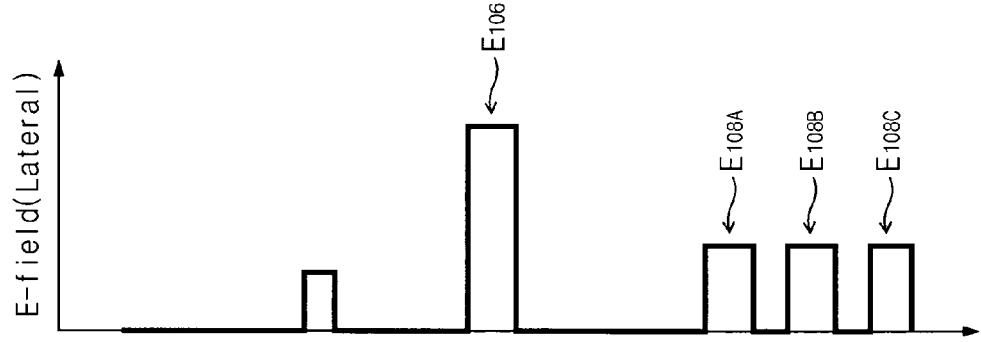
FIG. 12C illustrates the lateral electric field with respect to position at various positions along a channel of a selected cell string, in accordance with another embodiment of the present invention.
Figure 12B:
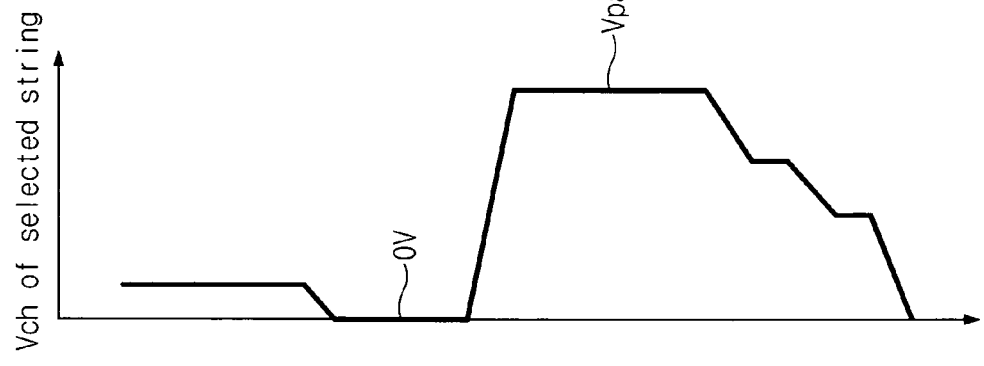
FIG. 12B illustrates the voltage potential with respect to position at various positions along a channel of a selected cell string, in accordance with another embodiment of the present invention.
Figure 12A:
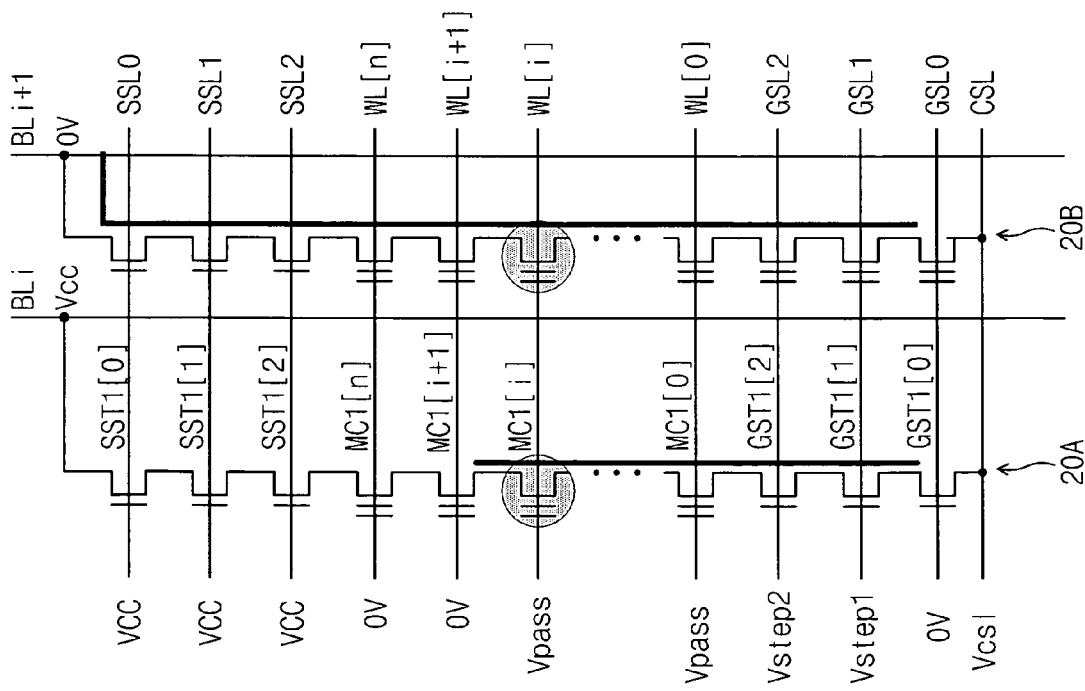
FIG. 12A is a schematic diagram of a memory cell array circuit illustrating a memory cell programming operation in accordance with another embodiment of the present invention.

FIG. 12A is a schematic diagram of a memory cell array circuit illustrating a memory cell programming operation in accordance with another embodiment of the present invention. FIG. 12B illustrates the voltage potential with respect to position at various positions along a channel of a selected cell string, in accordance with another embodiment of the present invention. FIG. 12C illustrates the lateral electric field with respect to position at various positions along a channel of a selected cell string, in accordance with another embodiment of the present invention.

Referring to FIGS. 12A-12C, the configuration of the memory cell array circuit is similar to the configuration of the embodiment of FIGS. 3A-3C described above, with the exception that the configuration of the present embodiment of FIGS. 12A-12C includes, in each cell string 20A, 20B, a plurality of ground select transistors GST, in this example, three ground select transistors GST0, GST1, GST2, in series between the lowermost memory cell transistor MC1[0] and the common source line CSL.

In the present embodiment, a programming operation is to be performed on a selected memory cell MC1[i] of a selected cell string 20A. However, in this embodiment, the relatively high first voltage Vpass is applied to the selected word line WL[i] connected to the control gate of the selected memory cell MC1[i], while a relatively low second voltage 0V is applied to the neighboring word line WL[i+1] connected to the control gate of the upper neighboring memory cell MC1[i+i]. In this example, the relatively low second voltage 0V is applied to the control gate of the upper neighboring memory cell MC1[i+1], rather than the lower neighboring memory cell MC1[i−1]. In this manner, a large electric field $E_{106}$ is present in the channel region of the selected cell string 20A between the selected memory cell MC1[i] and the upper neighboring memory cell MC1[i+1]. As described above, the presence of the electric field $E_{106}$ at this region causes the acceleration of electrons in a direction toward the charge storage layer of the selected memory cell transistor MC1[i] thereby programming the selected memory cell transistor MC1[i] in accordance with the GIDL-like effect described herein.

In addition, the GIDL-like effect is enhanced in the embodiment shown in FIGS. 12A-12C by application of the first voltage Vpass to the word lines WL[0] . . . WL[i−1] connected to the gates of the memory cell transistors MC1[0] . . . MC1[i−1] in series between the selected memory cell transistor MC1[i] and the at least one ground select transistors GST1[0], GST1[1], GST1[2]. This is in contrast with the embodiment of FIGS. 3A-3C above, wherein the relatively high first voltage Vpass is likewise applied to the word lines WL[1+1] . . . WL[n] connected to the gates of the memory cell transistors MC1[i+1] . . . MC1[n] in series between the selected memory cell transistor MC1[i] and the at least one string select transistors SST1[0], SST1[1], SST1[2].

Also, in the present embodiment, the second voltage 0V is likewise applied to the word lines WL[i+2] . . . WL[n] connected to the gates of the memory cell transistors MC1[i+2] . . . MC1[n] in series between the neighboring memory cell transistor MC1[i+1] and the at least one string select transistors SST1[0], SST1[1], SST1[2]. This is in contrast with the embodiment of FIGS. 3A-3C above, wherein the second voltage 0V is applied to the word lines WL[0] . . . WL[i−2] connected to the gates of the memory cell transistors MC1[0] . . . MC1[i−2] in series between the neighboring memory cell transistor MC1[i−1] and the ground select transistors GST1.

In the present embodiment, multiple ground select transistors GST1[0], GST1[1], GST1[2], in this case three ground select transistors GST1, are positioned in each cell string 20A, 20B, between the lowermost memory cell transistor MC1[0] and the common source line CSL. In accordance with the programming operation of embodiments of the present invention, various step voltages Vstep0, Vstep1, Vstep2 are applied to the ground select lines GSL0, GSL1, GSL2 connected to the string select transistors GST1[0], GST1[1], GST1[2]. This is in contrast with the embodiment of FIGS. 3A-3C above, wherein the various step voltages Vstep0, Vstep1, Vstep2 are applied to the ground select lines SSL0, SSL1, SSL2 connected to the string select transistors SST1[0], SST1[1], SST1[2]. In this manner, the electric field $E_{108A}$ present between the gate of the lowermost memory cell transistor MC1[0] and the gate of the third ground select transistor is sufficiently small so as to avoid GIDL-like effect programming of the lowermost memory cell transistor MC1[0] during programming of the selected memory cell transistor MC1[i].

To accomplish this, a stepwise reduction of the step voltage Vstep0, Vstep1, Vstep2 can be applied to the gates of the ground select transistors GST1[0], GST1[1], GST1[2]. For example, assuming that a Vcc level voltage is applied to the bit line BLi during a programming operation of memory cell MC1[i], and assuming a Vpass voltage of about 6-10 V is applied to the selected word line WL[i] and other word lines positioned between the selected word line WL[i] and the lowermost word line WL[0], step voltages in the range between about the Vcc level and the Vpass level and progressively increasing between the Vcc level and the Vpass level can be applied to the ground select lines GSL0, GSL1, GSL2. Assuming a Vcc voltage level of about 2V and a Vpass level of about 10V, a step voltage Vstep0 of 4V can be applied to the first ground select line GSL0, a step voltage Vstep1 of 6V can be applied to the second ground select line GSL1, and a step voltage Vstep2 of 8V can be applied to the third ground select line GSL2. In this manner, the resulting electric field $E_{108C}$ between the first and second ground select transistors GST1[0], GST1[1], the resulting electric field $E_{108B}$ between the second and third ground select transistors GST1[1], GST1[2], and the resulting electric field $E_{108A}$ between the third ground select transistor GST1[2] and the lowermost memory cell transistor MC1[0] are smaller that the electric field E106 between the selected memory cell transistor MC1[i] and the neighboring memory cell transistor MC1[i+1]. Therefore, the electric field $E_{108A}$ present between the gate of the lowermost memory cell transistor MC1[0] and the gate of the third ground select transistor GST1[2] is insufficient for causing GIDL-like effect programming of the lowermost memory cell transistor MC1[0] during programming of the selected memory cell transistor MC1[i].

Various embodiments, including those embodiments described above in connection with FIGS. 4A-4C, 5A-5C, 6A-6C, 7A-7C, 8A-8C, 9A-9C and 10, are applicable to the present embodiment described in connection with FIGS. 12A-12C.

The embodiment of FIGS. 12A-12C is particularly applicable to an embodiment wherein the programming operation is to be performed in a "minimum-to-maximum" arrangement, meaning that the programming operation is to be performed first for the lowermost memory cell MC1[0] in a cell string and last for an uppermost memory cell MC1[n] in a cell string. In contrast, a "maximum-to-minimum" programming operation is one that performs a programming operation first on the uppermost memory cell MC1[n] in a cell string and last on the lowermost memory cell MC1[0] in a cell string. Embodiments of the present invention are applicable to both "minimum-to-maximum" and "maximum-to-minimum" arrangements.

Figure 13:
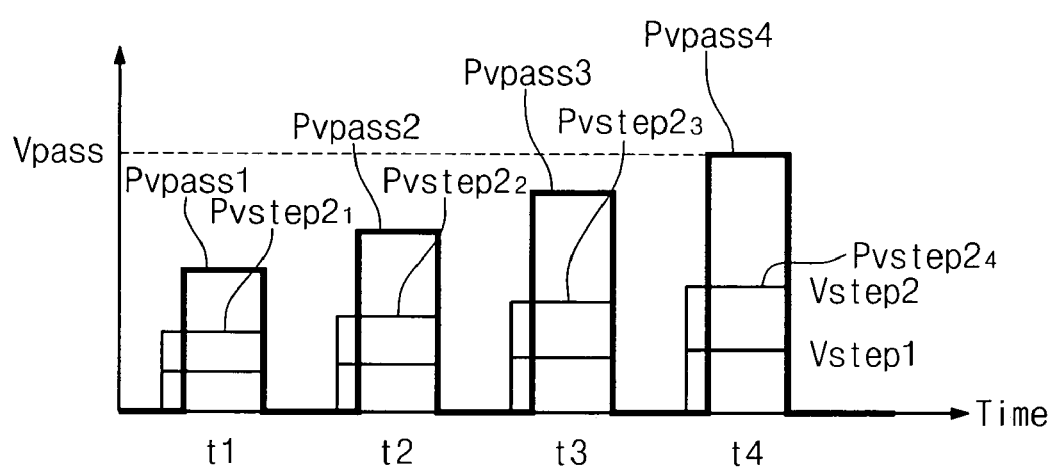
FIG. 13 is a waveform diagram of the application of the Vstep and Vpass voltages that are applied to the ground select transistors, the string select transistors, and/or the memory cell transistors during programming of a memory cell string, in accordance with another embodiment of the present invention.

FIG. 13 is a waveform diagram of the application of the Vstep and Vpass voltages that are applied to the ground select transistors GST1[0], GST1[1], GST1[2], the string select transistors SST1[0], SST1[1], SST1[2], and/or the memory cell transistors MC1[0 . . . n] during programming of a memory cell string 20A, in accordance with another embodiment of the present invention. In the embodiments described above in connection with FIGS. 1-9 and 12, and described below in connection with FIGS. 14A-14B, it is assumed that the voltages Vstep and Vpass that are applied to the gates of the various transistors in the cell string are applied at preselected, constant voltage levels. In the present embodiment, it is shown that the Vpass and Vstep voltages can, during a programming operation, be applied as a series of pulses, each pulse of the series gradually increasing in voltage during the programming operation.

For example, during the programming operation, at the time when the Vpass voltage is to be applied to the word line WL[i] of the memory cell transistor to be programmed MC1[i], the Vpass voltage can be applied as a series of pulses at time t1, t2, t3, t4, as shown. At time t1, a first pulse Pvpass1 is applied at a voltage level that is less than the Vpass voltage level. At time t2, a second pulse Pvpass2 is applied at a voltage level that is incrementally greater than the level of the first pulse Pvpass1, and still less than the Vpass voltage level. At time t3, a third pulse Pvpass3 is applied at a voltage level that is incrementally greater than the level of the second pulse PVpass2, and still less than the Vpass voltage level. At time t4, a fourth pulse Pvpass4 is applied at a voltage level that is equal to the Vpass voltage level.

Also, during the programming operation, the step voltages Vstep0, Vstep1, Vstep2 can be applied to the string select lines SSL0, SSL1, SSL2 and/or ground select lines GSL0, GSL1, GSL2 in a similar manner. For example, at the time when the Vstep2 voltage is to be applied to the string select line SSL2 of the string select transistor SST1[2], the Vstep2 voltage can be applied as a series of pulses at time t1, t2, t3, t4, as shown. At time t1, a first pulse $Pvstep2_1$ is applied at a voltage level that is less than the Vstep2 voltage level. At time t2, a second pulse $Pvstep2_2$ is applied at a voltage level that is incrementally greater than the level of the first pulse $Pvstep2_1$, and still less than the Vstep2 voltage level. At time t3, a third pulse $Pvstep2_3$ is applied at a voltage level that is incrementally greater than the level of the second pulse $Pvstep2_2$, and still less than the Vstep2 voltage level. At time t4, a fourth pulse $Pvstep2_4$ is applied at a voltage level that is equal to the Vstep2 voltage level.

In the present embodiment, the step voltages Vstep1, Vstep0, and other step voltages, can optionally be applied in a manner similar to the manner described above in connection with the second step voltage Vstep2.

While the above description of this embodiment illustrates application of four incremental pulses for application of the Vpass and Vstep voltages, the number of pulses can vary, for example, two, three, or more than four pulses can be applied. The magnitude of the voltage levels and the duration of the pulses can vary, depending on the desired application and transistor characteristics.

Figure 14A:
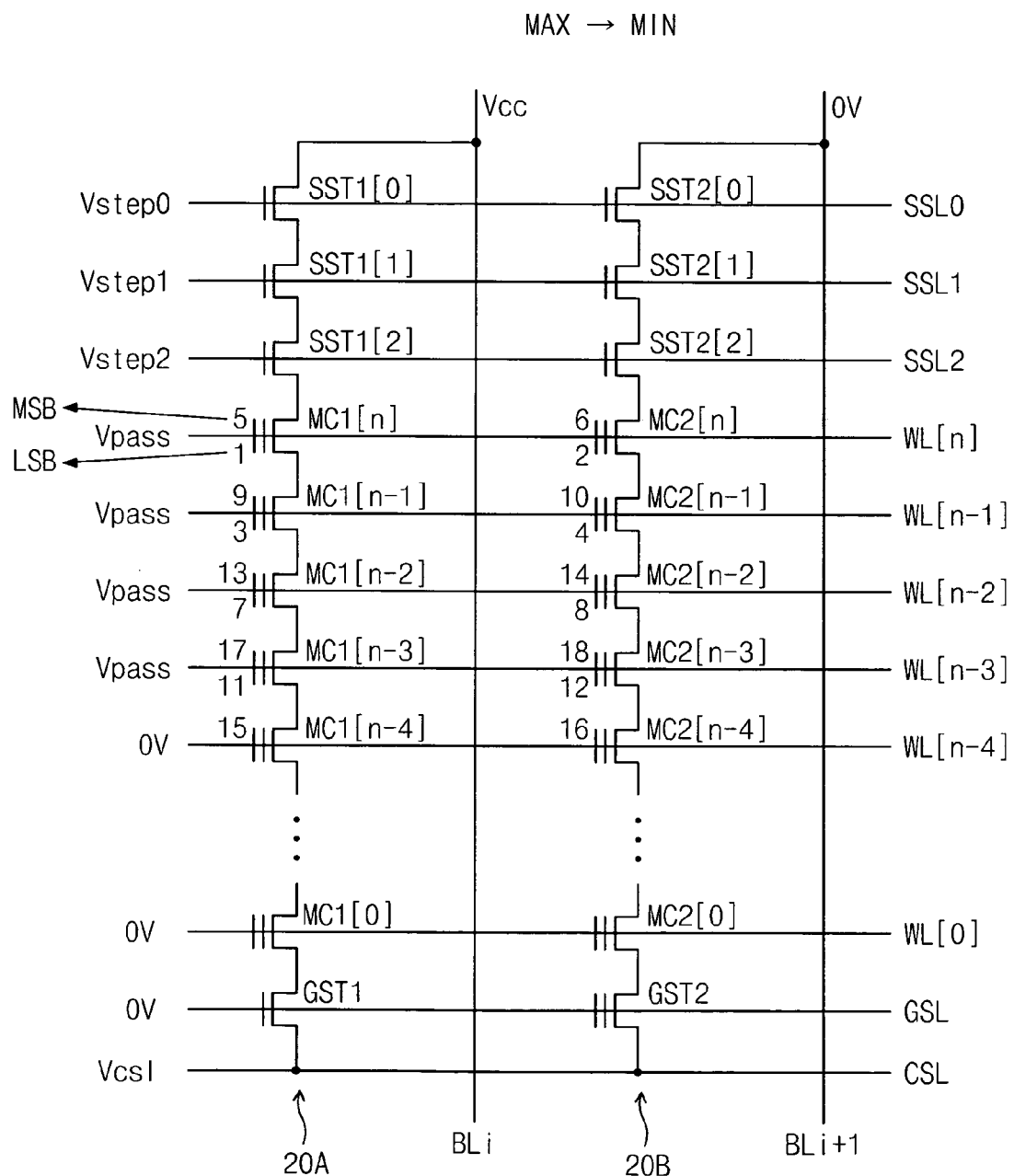
FIG. 14A is a schematic diagram of a memory cell array circuit illustrating a memory cell programming operation in a multiple-level cell configuration in a maximum-to-minimum programming arrangement, in accordance with another embodiment of the present invention.
Figure 14B:
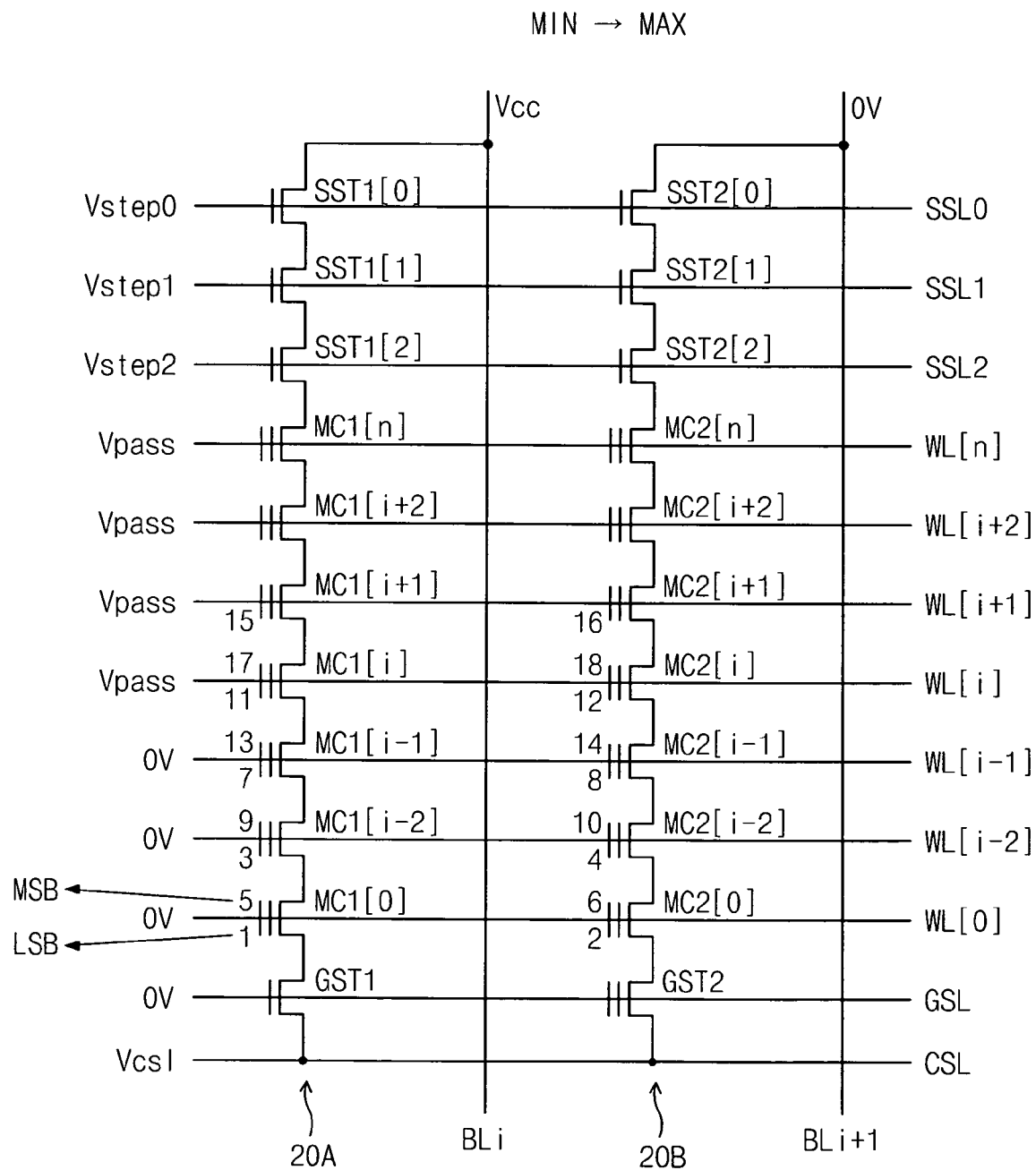
FIG. 14B is a schematic diagram of a memory cell array circuit illustrating a memory cell programming operation in a multiple-level cell configuration in a minimum-to-maximum programming arrangement, in accordance with another embodiment of the present invention.

FIG. 14A is a schematic diagram of a memory cell array circuit illustrating a memory cell programming operation in a multiple-level cell configuration in a maximum-to-minimum programming arrangement, in accordance with another embodiment of the present invention. FIG. 14B is a schematic diagram of a memory cell array circuit illustrating a memory cell programming operation in a multiple-level cell configuration in a minimum-to-maximum programming arrangement, in accordance with another embodiment of the present invention.

The concept of multiple-level cell programming is a recent advancement in the memory device industry, and is equally applicable to the principles of the present inventive concepts. In multiple-level cell programming, each memory cell MC1, MC2 is capable of storing more than a single binary bit of information, e.g. '0', '1'. For example, under multiple-level cell programming, two or more bits of information, e.g. '00', '01', '10', '11', can be stored in each memory cell MC1, MC2. The multiple levels are related to the amount of charge stored in charge storage layer of the memory cell, which in turn is related to the resulting threshold voltage Vth of a cell. For example, in some applications, a dual bit value of '00' can be represented by a −3V threshold voltage, a dual bit value of '01' can be represented by a +1V threshold voltage, a dual bit value of '10' can be represented by a +2.5V threshold voltage, and a dual bit value of '11' can be represented by a +4V threshold voltage.

Cell-to-cell coupling, or cell-to-cell interference can often times occur when there is a large change in the threshold voltage Vth of a cell, for example, due to a programming operation from the '00' state (−3V) to the '11' state (+4V), resulting in a total change in threshold voltage of 7V. As a result, neighboring cells can likewise be subject to a large shift in threshold voltage. This includes memory cells that neighbor the memory cell to be programmed within the same memory cell string, as well as memory cells that share the same word line as the memory cell to be programmed. This undesirable phenomenon is more significant with the industry trend toward further integration of memory devices.

A programming technique referred to in the art as "shadow programming" alleviates this problem by programming a cell in more than one step to ensure that there is no direct transition between the state having the lowest threshold voltage and the state having the highest threshold voltage. In the example given above, shadow programming ensures that no cells transition between the '00' and '11' state, thereby limiting the amount of Vth transition during a given programming operation. The shadow programming operation is applicable to the systems and methods of the embodiments of the invention described herein.

Shadow programming accomplishes its objective in two ways. First, shadow programming performs programming on one bit of the data at a time. For example, the least significant bit (LSB) is first programmed in an initial programming operation, followed by programming of the most significant bit (MSB) in a subsequent programming operation. Second, shadow programming avoids programming of neighboring memory cells of the same cell string during consecutive programming operations.

An example shadow programming operation for a multiple-level cell memory configuration is now described in connection with FIG. 14A. In this example, it is assumed that neighboring bit lines BLi, and BLi+1 are shared by the same page buffer. Referring to FIG. 14A, it can be seen that the shadow programming operation programs eighteen programming operations, numbered 1-18 on the memory cells MC1[0 . . . n] of the first cell string 20A, and on the memory cells MC2 [0 . . . n] of the second cell string 20B. At the instance shown in FIG. 14A, memory cell MC1[n−3] is being programmed, and so the voltage Vpass is applied to the word line WL[n−3] and 0V is applied to the neighboring word line WL [n−4], while the Vcc voltage is applied to the selected bit line BLi and 0V is applied to the unselected bit line BL[i+1].

According to the shadow programming operation in the example of FIG. 14A, programming is performed in a "maximum-to-minimum" direction; that is, programming is first performed on the memory cells MC1[n], MC2[n] neighboring the string select transistors SST1[2], SST1[1], SST1[0], and proceeding in a direction toward the memory cells MC1 [0], MC2[0] neighboring the ground select transistors GST1, GST2. Initially, as indicated by program number '1', the LSB of the data to be programmed in memory cell MC1[n] is programmed. Next, as indicated by program number '2', the LSB of the data to be programmed in memory cell MC2[n] is programmed. Next, as indicated by program number '3', the LSB of the data to be programmed in memory cell MC1[n−1] is programmed. Next, as indicated by program number '4', the LSB of the data to be programmed in memory cell MC2 [n−1] is programmed. Next, as indicated by program number '5', the MSB of the data to be programmed in memory cell MC1[n] is programmed. Next, as indicated by program number '6', the MSB of the data to be programmed in memory cell MC2[n] is programmed. Next, as indicated by program number '7', the LSB of the data to be programmed in memory cell MC1[n−2] is programmed. Next, as indicated by program number '8', the LSB of the data to be programmed in memory cell MC2[n−2] is programmed. Next, as indicated by program number '9', the MSB of the data to be programmed in memory cell MC1[$n$−1] is programmed. Next, as indicated by program number '10', the MSB of the data to be programmed in memory cell MC2[$n$−1] is programmed. The shadow programming operation proceeds in this manner until all memory cells MC1[0 . . . n], MC2[0 . . . n] in the first and second memory cell strings 20A, 20B have been programmed.

An alternative shadow programming operation for a multiple-level cell memory configuration is now described in connection with FIG. 14B. In this example, like the example of FIG. 14A, it is assumed that neighboring bit lines BLi, and BLi+1 are shared by the same page buffer. Referring to FIG. 14B, it can be seen that the shadow programming operation programs eighteen programming operations, numbered 1-18 on the memory cells MC1[0 . . . n] of the first cell string 20A, and on the memory cells MC2 [0 . . . n] of the second cell string 20B. At the instance shown in FIG. 14A, memory cell MC1[1] is being programmed, and so the voltage Vpass is applied to the word line WL[i] and 0V is applied to the neighboring word line MC1[$i$−1], while the Vcc voltage is applied to the selected bit line BLi and 0V is applied to the unselected bit line BL[i+1].

According to the shadow programming operation in the example of FIG. 14B, programming is performed in a "minimum-to-maximum" direction; that is, programming is first performed on the memory cells MC1[0], MC2[0] neighboring the neighboring the ground select transistors GST1, GST2, and proceeding in a direction toward the memory cells MC1[$n$], MC2[$n$] neighboring the string select transistors SST1[2], SST1[1], SST1[0]. Initially, as indicated by program number '1', the LSB of the data to be programmed in memory cell MC1[0] is programmed. Next, as indicated by program number '2', the LSB of the data to be programmed in memory cell MC2[0] is programmed. Next, as indicated by program number '3', the LSB of the data to be programmed in memory cell MC1[$i$−2] is programmed. Next, as indicated by program number '4', the LSB of the data to be programmed in memory cell MC2[$i$−2] is programmed. Next, as indicated by program number '5', the MSB of the data to be programmed in memory cell MC1[0] is programmed. Next, as indicated by program number '6', the MSB of the data to be programmed in memory cell MC2[0] is programmed. Next, as indicated by program number '7', the LSB of the data to be programmed in memory cell MC1[$i$−1] is programmed. Next, as indicated by program number '8', the LSB of the data to be programmed in memory cell MC2[$i$−1] is programmed. Next, as indicated by program number '9', the MSB of the data to be programmed in memory cell MC1[$i$−2] is programmed. Next, as indicated by program number '10', the MSB of the data to be programmed in memory cell MC2[$i$−2] is programmed. The shadow programming operation proceeds in this manner until all memory cells MC1[0 . . . n], MC2[0 . . . n] in the first and second memory cell strings 20A, 20B have been programmed.

Variations of the shadow programming operation described above are equally applicable to the principles of the present invention. For example, the MSB values of data to be programmed can first be stored, followed by the LSB values; i.e., "maximum-to-minimum". Also, more than two bit lines BLi, BLi+1 can be shared by the same page buffer, in which case, the shadow programming operation can consecutively program cells of more than two neighboring memory cell strings. Other variations are possible and equally applicable, including both "minimum-to-maximum" and "maximum-to-minimum" arrangements that are not shadow programming arrangements.

Figure 15A:
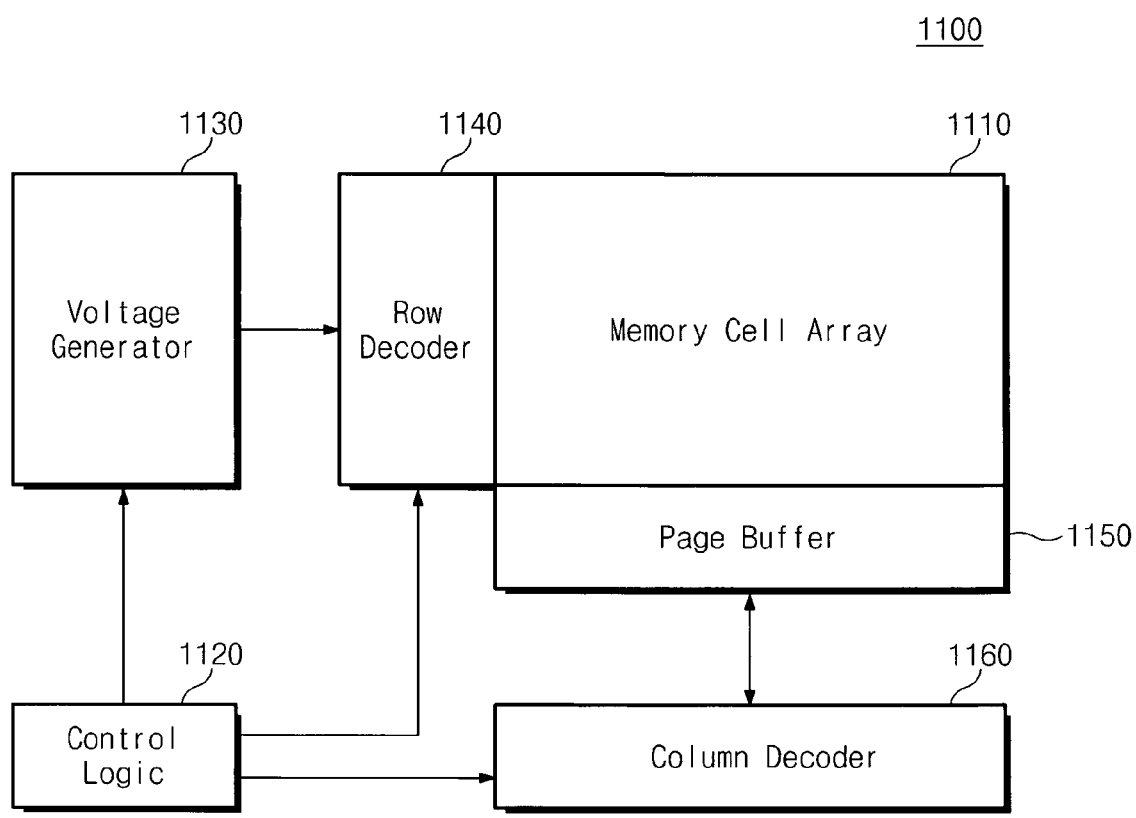
FIG. 15A is a block diagram of a memory device in accordance with embodiments of the present invention.

FIG. 15A is a block diagram of a memory device in accordance with embodiments of the present invention. A memory device 1100 includes a memory cell array 1110, control logic 1120, a voltage generator 1130, a row decoder 1140, a page buffer 1150, and a column decoder 1160. The memory cell array 1110 includes a plurality of memory cell strings 20A, 20B of the type described herein, optionally arranged in memory blocks. Control logic 1120 transmits control signals to the voltage generator 1130, the row decoder 1140 and the column decoder 1160 in accordance with the operation to be performed, for example, erase, programming, and read operations. The voltage generator 1130 generates the voltages such as Vpass, Vread, Verase, Vstep voltages required for performing the device operations. The row decoder 1140 determines the manner in which the voltage signals provided by the voltage generator are applied to the lines, such as string select lines SSL, word lines WLk, ground select lines GSL, and common source lines of the memory cell array 1110. The column decoder determines which signals of the bit lines BLn of the device read by the page buffer 1150 are to be used in determining data values that are read, or determines voltages that are applied to the bit lines BLn during programming and erase operations.

Figure 15B:
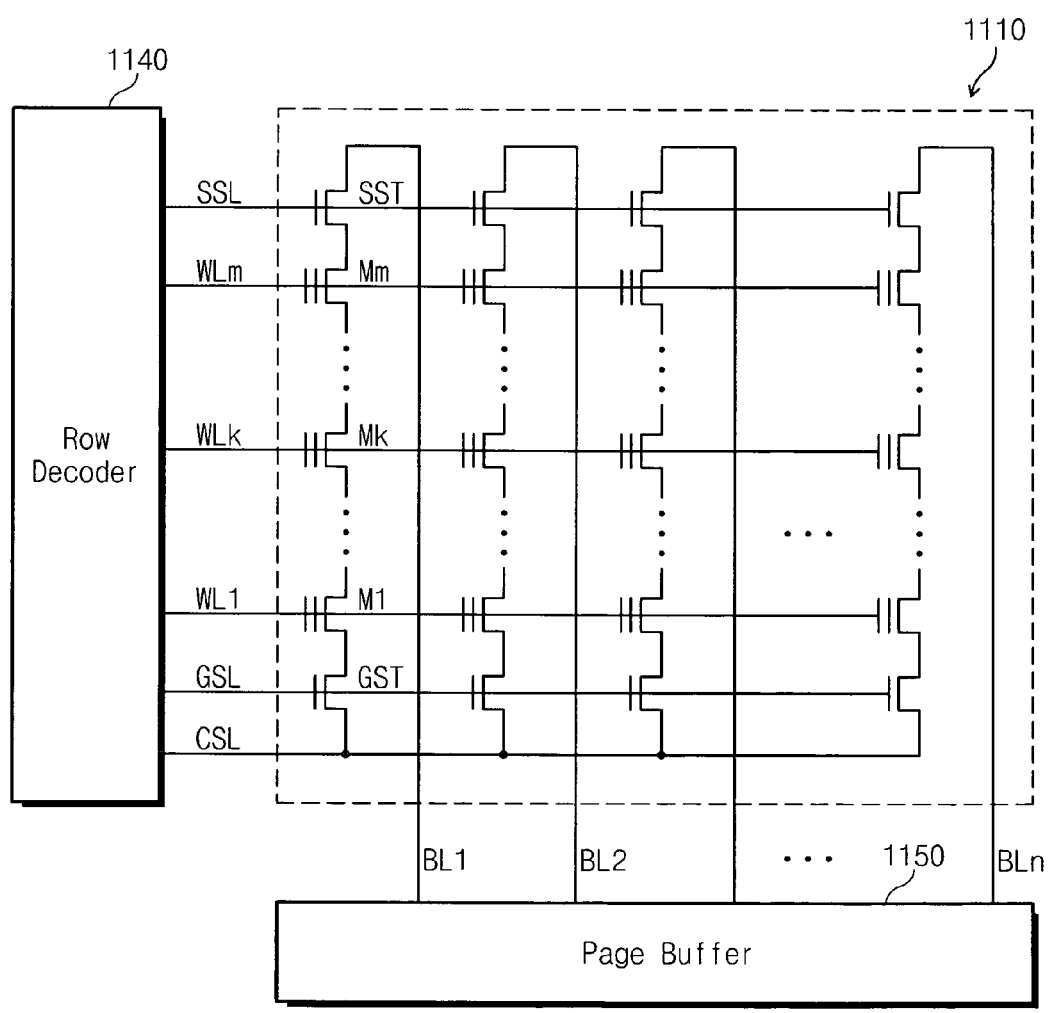
FIG. 15B is a block diagram of the memory cell array of the memory device of FIG. 15A, in accordance with embodiments of the present invention.

FIG. 15B is a block diagram of the memory cell array 1110, of the memory device 1100 of FIG. 15A, in accordance with embodiments of the present invention. In this figure it can be seen that the row decoder 1140 applies the various voltage levels to the one of or more string select lines SSL, the word lines WLk, the ground select line GSL, and the common source line CSL. The page buffer 1150 is connected to the bit lines BLn of the device 1110.

Figure 16:
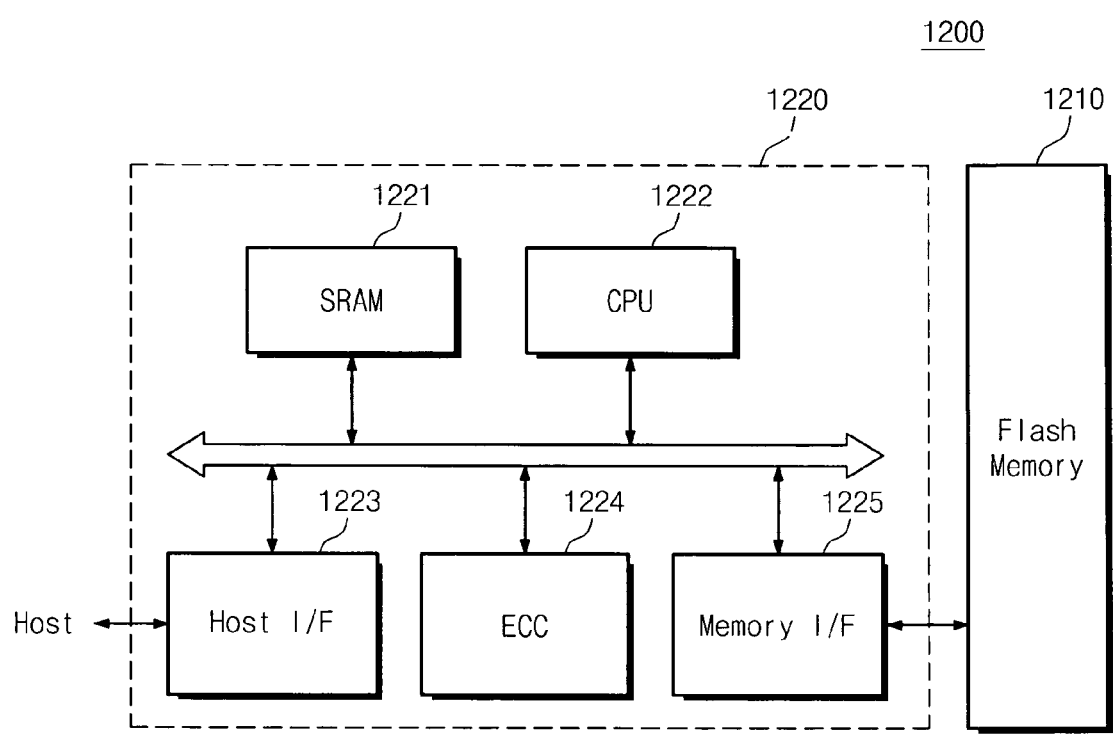
FIG. 16 is a block diagram of a memory card that includes a semiconductor device in accordance with the embodiments of the present invention.

FIG. 16 is a block diagram of a memory card that includes a semiconductor device in accordance with the embodiments of the present invention. The memory card 1200 includes a memory controller 1220 that generates command and address signals C/A and a memory module 1210 for example, flash memory 1210 that includes one or a plurality of flash memory devices. The memory controller 1220 includes a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device includes a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 included on the memory controller 1220 and the memory module 1210 can employ memory devices that are programmable according to the inventive concepts disclosed herein.

Figure 17:
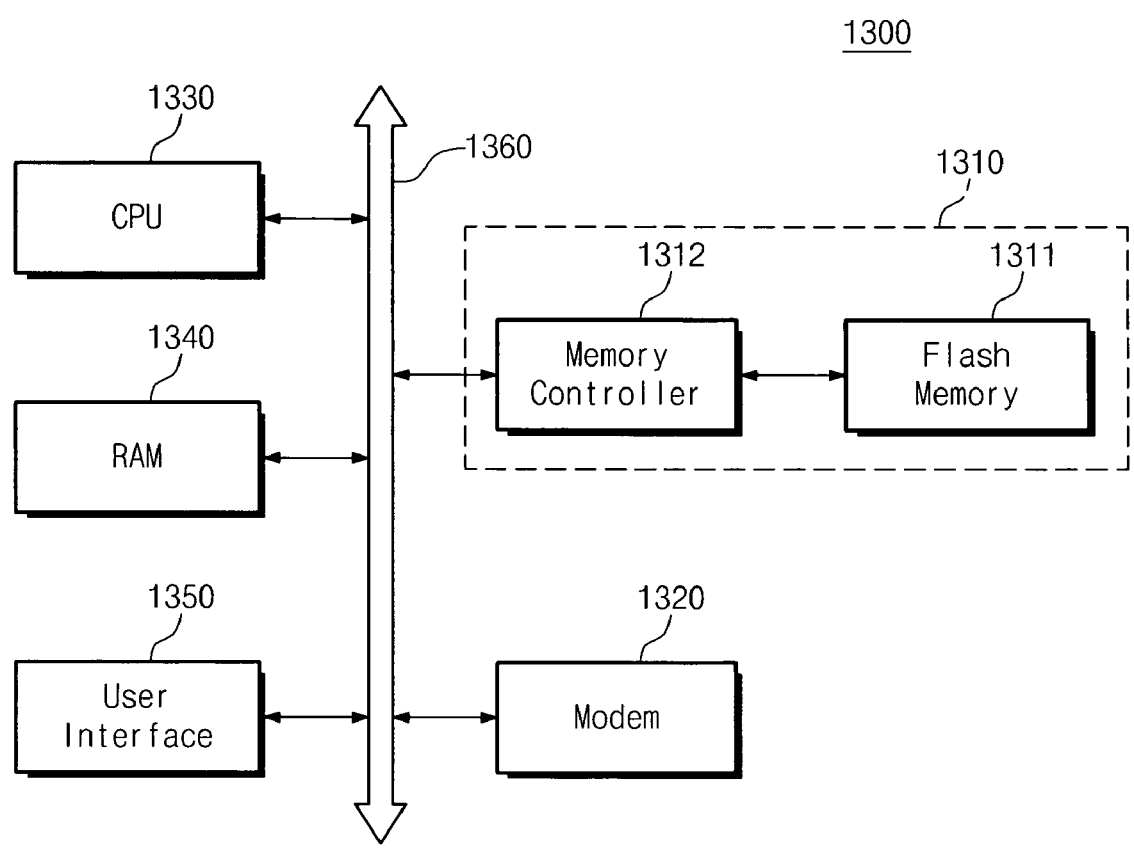
FIG. 17 is a block diagram of a memory system that employs a memory module, for example, of the type described herein, in accordance with the embodiments of the present invention.

FIG. 17 is a block diagram of a memory system 1300 that employs a memory module 1310, for example, of the type described herein. The memory system 1300 includes a processor 1330, random access memory 1340, user interface 1350 and modem 1320 that communicate via a common bus 1360. The devices on the bus 1360 transmit signals to and receive signals from the memory card 1310 via the bus 1360.

Each of the components of the memory system 1300, including the processor 1330, random access memory 1340, user interface 1350 and modem 1320 along with the memory card 1310 can employ vertically oriented memory devices of the type disclosed herein. The memory system 1300 can find application in any of a number of electronic applications, for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

It should be noted that programming operations in accordance with embodiments of the present invention can be applied to non-volatile flash memory devices of various types, including, for example, charge trapping layer devices and floating gate type devices.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A method of programming a non-volatile memory device, the memory device including: a plurality of memory cell transistors arranged in a plurality of transistor strings, wherein a transistor string includes a plurality of memory cell transistors arranged in series; a plurality of word lines, each word line connected to a corresponding memory cell transistor of each of the different transistor strings; and a plurality of bit lines, each bit line connected to one of the transistor strings, the method comprising:
applying a first voltage to a selected word line corresponding to a selected memory cell transistor of a selected transistor string to be programmed; and
applying a second voltage to a neighboring word line neighboring the selected word line and corresponding to a neighboring transistor of the selected transistor string, wherein the first voltage is greater than the second voltage,
the application of the first and second voltages to the selected and neighboring word lines respectively causing electrons in the active region between the neighboring transistor and the selected memory cell transistor, to be accelerated toward the selected memory cell transistor and injecting into a charge storage layer of the selected memory cell transistor,
wherein each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising:
applying the first voltage to unselected word lines corresponding to unselected memory cell transistors of the selected transistor string positioned between the selected memory cell transistor and the other of the ground select transistor and the string select transistor.

2. The method of claim 1 wherein applying the first voltage to the selected word line comprises applying a first voltage that comprises a pulsed signal that has a voltage value that incrementally increases at each pulse.

3. The method of claim 1 further comprising applying a third voltage to a bit line corresponding to the selected transistor string and applying a fourth voltage to bit lines corresponding to unselected transistor strings, wherein the third voltage is at a voltage level that is greater than the fourth voltage, wherein the third voltage is at a voltage level that is sufficient to channel-boost a channel region of the selected memory cell transistor of the selected transistor string, and wherein the fourth voltage is at a voltage level that is insufficient to channel-boost channel regions of memory cell transistors of the unselected transistor strings.

4. The method of claim 1 wherein each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising:
applying a fifth voltage to unselected word lines corresponding to unselected memory cell transistors of the selected transistor string positioned between the selected memory cell transistor and the other of the ground select transistor and the string select transistor, wherein the fifth voltage is less than the first voltage and wherein the fifth voltage is greater than the second voltage.

5. The method of claim 1 wherein each transistor string includes a plurality of the memory cell transistors arranged in series between a string select transistor and a ground select transistor, and wherein the memory device further includes a string select line, the string select line connected to a string select transistor of each of the different transistor strings and further comprising:
applying a plurality of descending voltage signals to the string select line and to at least one word line neighboring the string select line of the transistor string, the descending voltage signals having different voltage levels, the voltage level being greatest for the descending voltage signal applied to the word line most proximal to the selected word line, and the voltage level being lowest for the descending voltage signal applied to the string select line connected to the string select transistor.

6. The method of claim 1 wherein each transistor string includes a plurality of the memory cell transistors arranged in series between a string select transistor and a ground select transistor, and wherein the memory device further includes a string select line, the string select line connected to a string select transistor of each of the different transistor strings and wherein the plurality of memory cell transistors are spaced apart from each other by a first distance, and wherein the string select transistor is spaced apart from a neighboring memory cell transistor by a second distance that is greater than the first distance.

7. The method of claim 1 wherein each transistor string includes a plurality of the memory cell transistors arranged in series between a string select transistor and an end ground select transistor and wherein the memory device further includes a plurality of ground select lines, each ground select line connected to one of a corresponding end ground select transistor of each of the different transistor strings, and at least one dummy ground select transistor neighboring the end ground select transistor, and further comprising:
applying a plurality of descending voltage signals to the plurality of ground select lines, the descending voltage signals having different voltage levels, the voltage level being greatest for the descending voltage signal applied to the ground select line most proximal to the selected word line, and the voltage level being lowest for the descending voltage signal applied to the ground select line connected to the end ground select transistor.

8. The method of claim 1 wherein each transistor string includes a plurality of the memory cell transistors arranged in series between a string select transistor and a ground select transistor, and wherein the memory device further includes a ground select line, the ground select line connected to a ground select transistor of each of the different transistor strings and further comprising:

applying a plurality of descending voltage signals to the ground select line and to at least one word line neighboring the ground select line of the transistor string, the descending voltage signals having different voltage levels, the voltage level being greatest for the descending voltage signal applied to the word line most proximal to the selected word line, and the voltage level being lowest for the descending voltage signal applied to the ground select line connected to the ground select transistor.

9. The method of claim 1 wherein the first voltage is in a range of about 6 volts to about 12 volts.

10. The method of claim 1 wherein the second voltage is in a range of about −30 volts to about 2 volts.

11. The method of claim 1 wherein the memory cell transistors comprise a transistor type selected from the group consisting of SONOS-type, SANOS-type, TANOS-type, CTF-type and, floating gate type.

12. A multiple-level cell (MLC) programming operation of a non-volatile memory device including the method of programming of claim 1.

13. A shadow programming operation of a non-volatile memory device including the method of programming of claim 1.

14. The method of claim 1, further comprising:
repeating the application of the first voltage and second voltage in an ascending order of the word lines beginning with the word line most proximal to the ground select transistor for programming memory cells connected to the respective word lines in the ascending order.

15. The method of claim 1, further comprising:
repeating the application of the first voltage and second voltage in an descending order of the word lines beginning with the word line most proximal to the ground select transistor for programming memory cells connected to the respective word lines in the descending order.

16. A method of programming a non-volatile memory device, the memory device including: a plurality of memory cell transistors arranged in a plurality of transistor strings; a plurality of word lines, each word line connected to a corresponding memory cell transistor of each of the different transistor strings; and a plurality of bit lines, each bit line connected to one of the transistor strings, the method comprising:

applying a first voltage to a selected word line corresponding to a selected memory cell transistor of a selected transistor string to be programmed; and applying a second voltage to a neighboring word line neighboring the selected word line and corresponding to a neighboring transistor of the selected transistor string, wherein the first voltage is greater than the second voltage, wherein each transistor string includes a plurality of the memory cell transistors arranged in series between a string select transistor and a ground select transistor and wherein the neighboring transistor is positioned between the selected memory cell transistor and one of the ground select transistor and the string select transistor, and further comprising:

applying the first voltage to unselected word lines corresponding to unselected memory cell transistors of the selected transistor string positioned between the selected memory cell transistor and the other of the ground select transistor and the string select transistor; and applying the second voltage to unselected word lines positioned between the neighboring transistor and the one of the ground select transistor and the string select transistor.

17. The method of claim 16 wherein the application of the first and second voltages to the selected and neighboring word lines respectively causes electrons to be generated by an electric field formed between the neighboring transistor and the selected memory cell transistor, the electrons accelerating toward the selected memory cell transistor and injecting into a charge storage layer of the selected memory cell transistor.

18. A method of programming a non-volatile memory device, the memory device including: a plurality of memory cell transistors arranged in a plurality of transistor strings, wherein a transistor string includes a plurality of memory cell transistors arranged in series; a plurality of word lines, each word line connected to a corresponding memory cell transistor of each of the different transistor strings; and a plurality of bit lines, each bit line connected to one of the transistor strings, the method comprising:

applying a first voltage to a selected word line corresponding to a selected memory cell transistor of a selected transistor string to be programmed; and applying a second voltage to a neighboring word line neighboring the selected word line and corresponding to a neighboring transistor of the selected transistor string, wherein the first voltage is greater than the second voltage, the application of the first and second voltages to the selected and neighboring word lines respectively causing electrons in the active region between the neighboring transistor and the selected memory cell transistor, to be accelerated toward the selected memory cell transistor and injecting into a charge storage layer of the selected memory cell transistor, wherein each transistor string includes a plurality of the memory cell transistors arranged in series between an end string select transistor and a ground select transistor and wherein the memory device further includes a plurality of string select lines, each string select line connected to one of a corresponding end string select transistor of each of the different transistor strings, and at least one dummy string select transistor neighboring the end string select transistor, and further comprising:

applying a plurality of descending voltage signals to the plurality of string select lines, the descending voltage signals having different voltage levels, the voltage level being greatest for the descending voltage signal applied to the string select line most proximal to the selected word line, and the voltage level being lowest for the descending voltage signal applied to the string select line connected to the end string select transistor.

19. The method of claim 18 wherein applying the plurality of descending voltage signals comprises, for each of the descending voltage signals, applying a voltage signal that comprises a pulsed signal that has a voltage value that incrementally increases at each pulse.

* * * * *